US012322688B2

(12) United States Patent
Wang et al.

(10) Patent No.: US 12,322,688 B2
(45) Date of Patent: Jun. 3, 2025

(54) PACKAGE STRUCTURE INCLUDING AUXILIARY DIELECTRIC PORTION

(71) Applicant: Taiwan Semiconductor Manufacturing Company, Ltd., Hsinchu (TW)

(72) Inventors: Po-Han Wang, Hsinchu (TW); Sih-Hao Liao, New Taipei (TW); Wei-Chih Chen, Taipei (TW); Hung-Chun Cho, Hsinchu (TW); Ting-Chen Tseng, Hsinchu (TW); Yu-Hsiang Hu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 479 days.

(21) Appl. No.: 17/683,375

(22) Filed: Mar. 1, 2022

(65) Prior Publication Data

US 2023/0282558 A1    Sep. 7, 2023

(51) Int. Cl.
*H01L 23/49* (2006.01)
*H01L 21/48* (2006.01)
*H01L 23/498* (2006.01)

(52) U.S. Cl.
CPC .... *H01L 23/49838* (2013.01); *H01L 21/4857* (2013.01); *H01L 23/49811* (2013.01); *H01L 23/49822* (2013.01); *H01L 23/49833* (2013.01); *H01L 2224/02372* (2013.01)

(58) Field of Classification Search
CPC ......... H01L 23/49838; H01L 23/49811; H01L 23/49822; H01L 23/49833; H01L 23/5386; H01L 23/5389; H01L 23/49816; H01L 25/105; H01L 2224/02372; H01L 2225/1035; H01L 2225/1041
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |

(Continued)

*Primary Examiner* — Ida M Soward
(74) *Attorney, Agent, or Firm* — JCIPRNET

(57) ABSTRACT

A package structure includes a first redistribution layer, a semiconductor die and a second redistribution layer. The first redistribution layer includes a first dielectric layer, first conductive elements, second conductive elements, a top dielectric layer and an auxiliary dielectric portion. The first conductive elements and the second conductive elements are disposed on the first dielectric layer with a first pattern density and a second pattern density respectively. The top dielectric layer is disposed on the first dielectric layer and covering a top surface of the second conductive elements. The auxiliary dielectric portion is disposed in between the first dielectric layer and the top dielectric layer, and covering a top surface of the first conductive elements. The semiconductor die is disposed on the first redistribution layer. The second redistribution layer is disposed on the semiconductor die, and electrically connected to the semiconductor die and the first redistribution layer.

15 Claims, 25 Drawing Sheets

(56) References Cited

U.S. PATENT DOCUMENTS

| | | | |
|---|---|---|---|
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,793,246 B1* | 10/2017 | Tseng | H01L 23/3128 |
| 10,276,543 B1* | 4/2019 | Liao | H01L 25/50 |
| 10,381,309 B2* | 8/2019 | Wang | H01L 25/105 |
| 10,777,518 B1* | 9/2020 | Wang | H01L 21/4857 |
| 10,879,220 B2* | 12/2020 | Yu | H01L 23/5383 |
| 2019/0131270 A1* | 5/2019 | Lee | H01L 24/19 |
| 2020/0006290 A1* | 1/2020 | Chang Chien | H01L 25/50 |
| 2020/0402942 A1* | 12/2020 | Chen | H01L 24/95 |
| 2021/0090993 A1* | 3/2021 | Yu | H01L 23/49811 |
| 2021/0183783 A1* | 6/2021 | Park | H01L 23/5383 |
| 2021/0265313 A1* | 8/2021 | Chen | H01L 24/08 |
| 2024/0213237 A1* | 6/2024 | Chen | H01L 21/4857 |
| 2024/0387367 A1* | 11/2024 | Tang | H01L 24/20 |

* cited by examiner

PACKAGE STRUCTURE INCLUDING AUXILIARY DIELECTRIC PORTION

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. In addition, such packages may further be integrated to a semiconductor substrate or carrier after dicing. Therefore, the reliability of the electrical connection between conductive terminals and an internal component (e.g. a redistribution circuit structure) within each package becomes important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
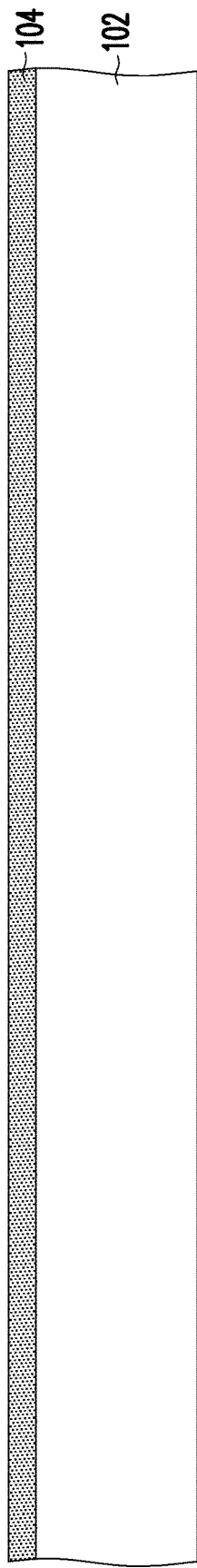
FIG. 1 to FIG. 12 are schematic sectional views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 12 are schematic sectional views of various stages in a method of fabricating a package structure according to some exemplary embodiments of the present disclosure. Referring to FIG. 1, a carrier 102 is provided. In some embodiments, the carrier 102 may be a glass carrier or any suitable carrier for carrying a semiconductor wafer or a reconstituted wafer for the manufacturing method of the package structure. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 304 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

In an alternative embodiment, a buffer layer (not shown) may be coated on the debond layer 104, where the debond layer 104 is sandwiched between the buffer layer and the carrier 102, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Figure 2:
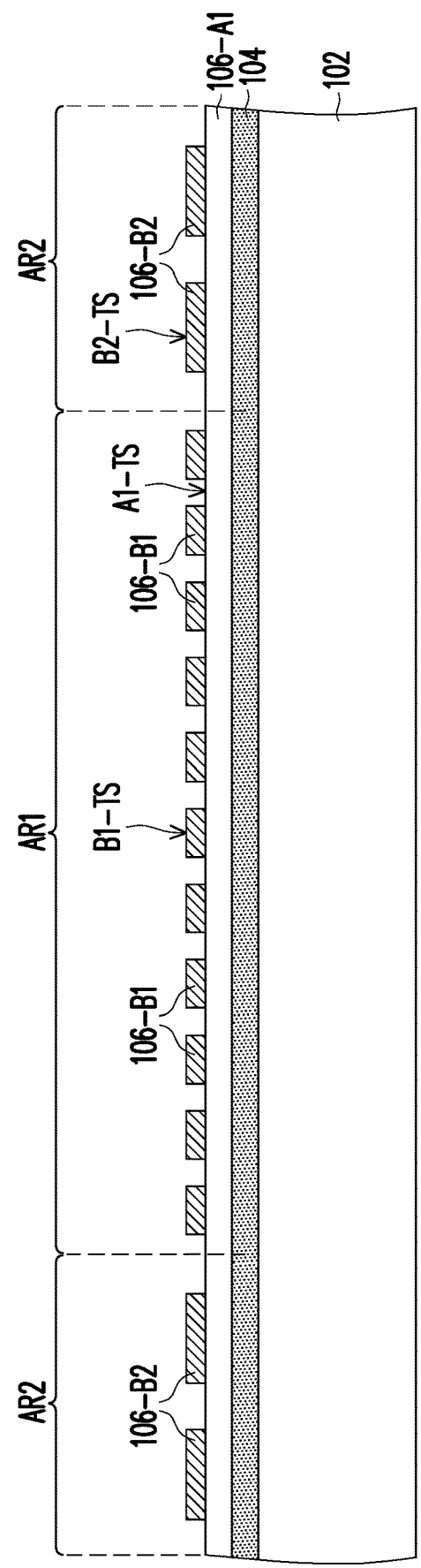

As illustrated in FIG. 2 to FIG. 6, a method of fabricating a first redistribution layer 106 (or backside redistribution layer) over the carrier 102 is described. Referring to FIG. 2, a bottom dielectric layer 106-A1 is formed over the debond layer 104. For example, the bottom dielectric layer 106-A1 has a planar top surface A1-TS. In some embodiments, a first conductive layer 106B is disposed on the planar top surface A1-TS of the bottom dielectric layer 106-A1. In some embodiments, the first conductive layer 106B may include a plurality of first conductive elements 106-B1 and a plurality of second conductive elements 106-B2. For example, the first conductive elements 106-B1 are disposed in a first region AR1 over the carrier 102 and having a first pattern density, while the second conductive elements 106-B2 are disposed in a second region AR2 over the carrier 102 and having a second pattern density. In certain embodiments, the second pattern density is greater than the first pattern density. In other words, the second conductive elements 106-B2 are arranged in a denser manner than the first conductive elements 106-B1 within a given area on the bottom dielectric layer 106-A1. As further illustrated in FIG. 2, the first conductive layer 106B has a planar top surface. For example, a top surface B1-TS of the first conductive elements 106-B1 of the first conductive layer 106B is substantially coplanar with a top surface B2-TS of the second conductive elements 106-B2 of the first conductive layer 106B.

Figure 3:
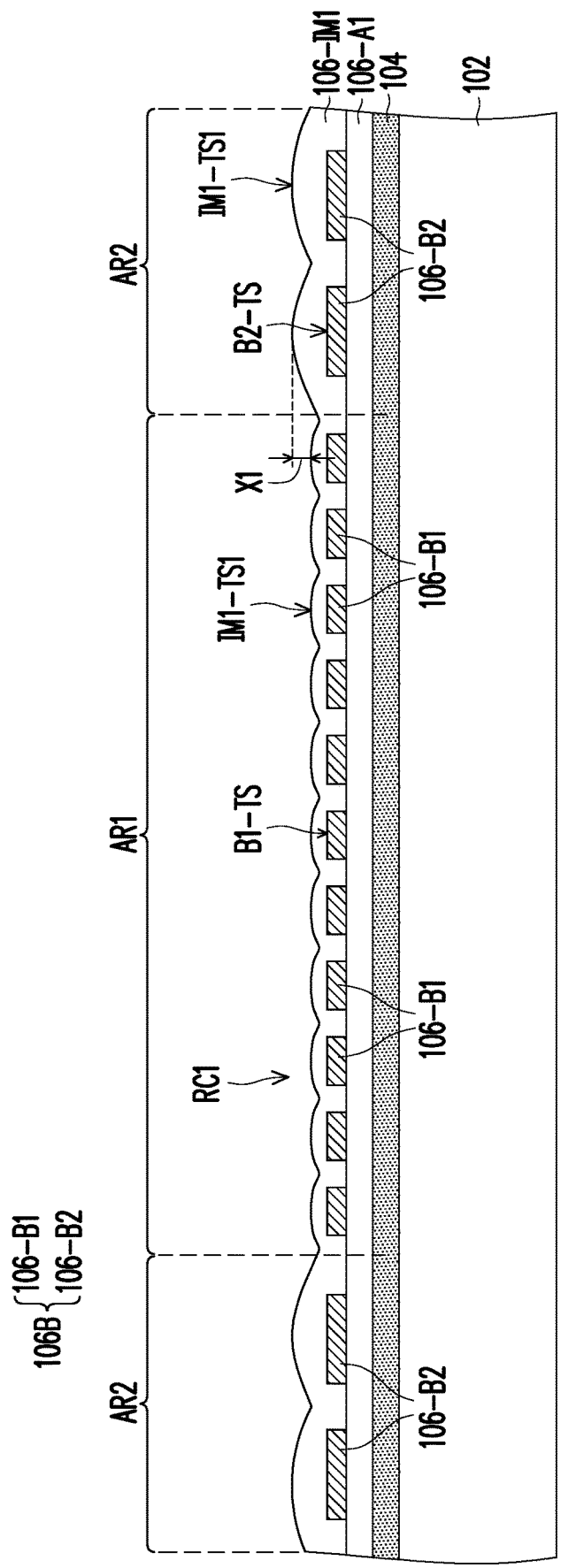

Referring to FIG. 3, in a subsequent step, an intermediate dielectric layer 106-IM1 (or a first dielectric layer) is disposed on the bottom dielectric layer 106-A1 and covering the first conductive layer 106B. In some embodiments, the intermediate dielectric layer 106-IM1 has an uneven top surface IM1-TS1. Furthermore, the intermediate dielectric layer 106-IM1 may include a recessed portion RC1, whereby the uneven top surface IM1-TS1 in the first region AR1 is recessed from the uneven top surface IM1-TS1 in the second region AR2. For example, the uneven top surface IM1-TS1 in the first region AR1 and the uneven top surface IM1-TS1 in the second region AR2 has a step height difference X1 that defines the recessed portion RC1. In the exemplary embodiment, due to a lower density of the first conductive elements 106-B1 in the first region AR1, the intermediate dielectric layer 106-IM1 covering the first conductive elements 106-B1 over the first region AR1 have a reduced height (the recessed portion RC1). Furthermore, due to a higher density of the second conductive elements 106-B2 in the second region AR2, the intermediate dielectric layer 106-IM1 covering the second conductive elements 106-B2 over the second region AR2 have an increased height.

Figure 4:
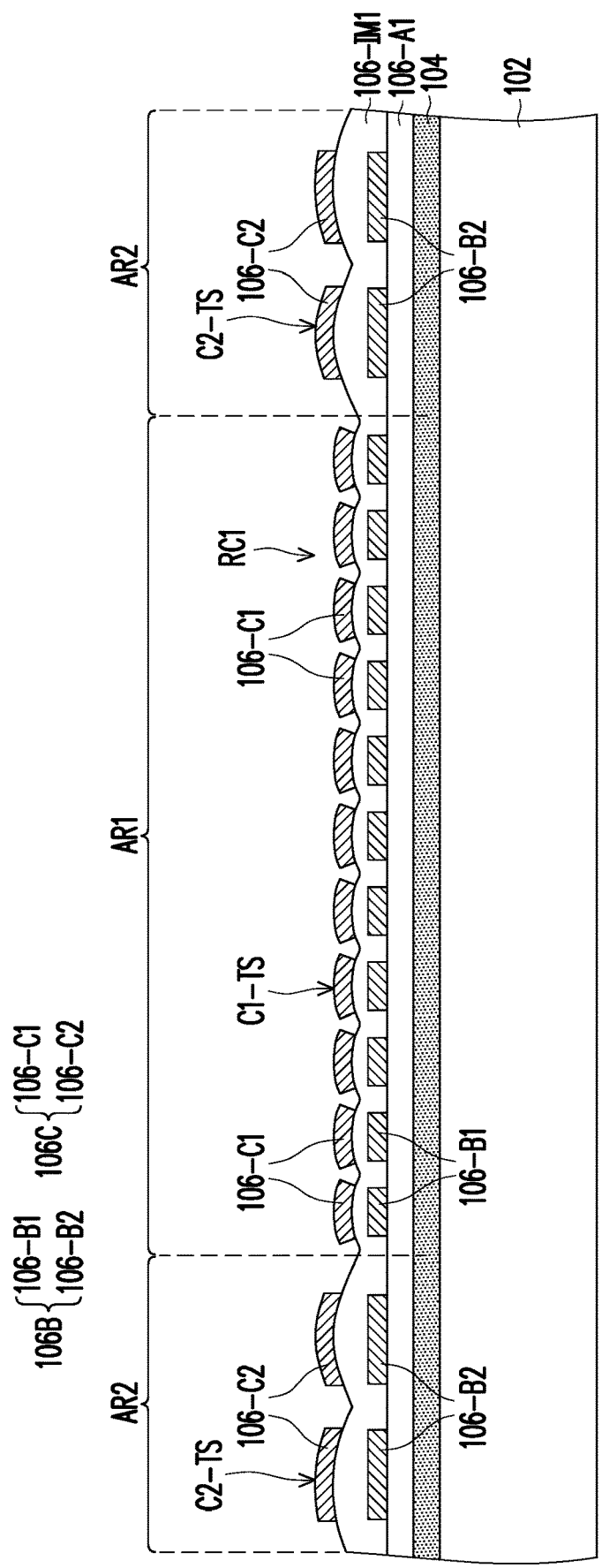

Referring to FIG. 4, after forming the intermediate dielectric layer 106-IM1, a second conductive layer 106C is formed on the uneven top surface IM1-TS1 of the intermediate dielectric layer 106-IM1. In some embodiments, the second conductive layer 106C may include a plurality of first conductive elements 106-C1 and a plurality of second conductive elements 106-C2 disposed over the intermediate dielectric layer 106-IM1. For example, the first conductive elements 106-C1 are disposed in the first region AR1 over the first conductive elements 106-B1 and having a first pattern density, while the second conductive elements 106-C2 are disposed in the second region AR2 over the second conductive elements 106-B2 and having a second pattern density. In certain embodiments, the second pattern density is greater than the first pattern density. In other words, the second conductive elements 106-C2 are arranged in a denser manner than the first conductive elements 106-C1 within a given area on the intermediate dielectric layer 106-IM1. In some embodiments, the first conductive elements 106-C1 are disposed in the recessed portion RC1 of the intermediate dielectric layer 106-IM1, while the second conductive elements 106-C2 are disposed on the intermediate dielectric layer 106-IM1 in regions outside of the recessed portion RC1. As further illustrated in FIG. 4, the second conductive layer 106C has a curved top surface. For example, a top surface C1-TS of the first conductive elements 106-C1 and a top surface C2-TS of the second conductive elements 106-C2 of the second conductive layer 106C are all curved.

Figure 5:
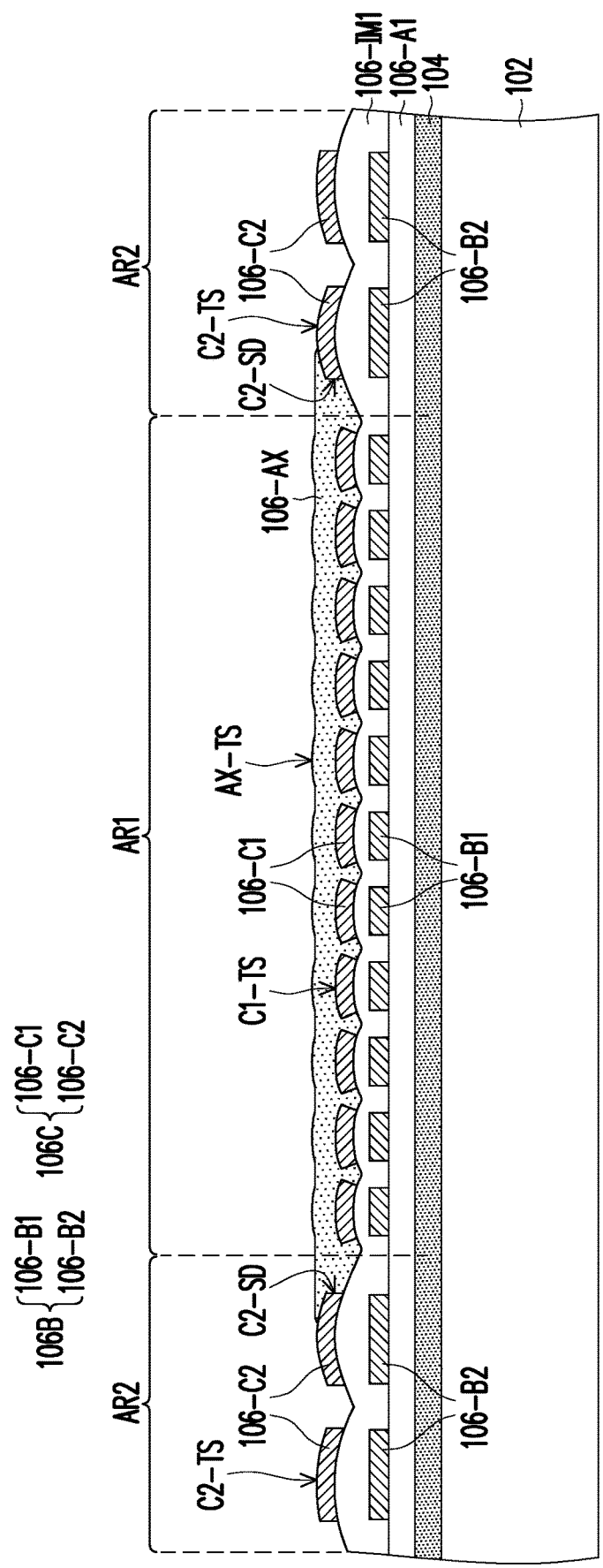

Referring to FIG. 5, at least one auxiliary dielectric portion 106-AX is formed over the intermediate dielectric layer 106-IM1, and covering and contacting a first portion of the second conductive layer 106C, and revealing a second portion of the second conductive layer 106C. For example, the auxiliary dielectric portion 106-AX is disposed on the recessed portion RC1 of the intermediate dielectric layer 106-IM1 and covering and contacting the top surface C1-TS of the first conductive elements 106-C1, while revealing portions of the second conductive elements 106-C2. In some embodiments, the auxiliary dielectric portion 106-AX is covering and contacting the uneven top surface IM1-TS1 of the intermediate dielectric layer 106-IM1. In some embodiments, the auxiliary dielectric portion 106-AX has a substantially planar top surface AX-TS. In some embodiments, the auxiliary dielectric portion 106-AX extends from the first region AR1 towards the second region AR2 to cover and contact a side surface C2-SD of the second conductive elements 106-C2. Furthermore, the auxiliary dielectric portion 106-AX is covering and contacting a first portion of a top surface C2-TS of the second conductive elements 106-C2, while revealing a second portion of the top surface C2-TS of the second conductive elements 106-C2. In other words, the auxiliary dielectric portion 106-AX partially covers the top surface C2-TS of the second conductive elements 106-C2. In one embodiment, the auxiliary dielectric portion 106-AX is made of a material that is different from a material of the intermediate dielectric layer 106-IM1. In another embodiment, the auxiliary dielectric portion 106-AX and the intermediate dielectric layer 106-IM1 are made of the same material.

Figure 6:
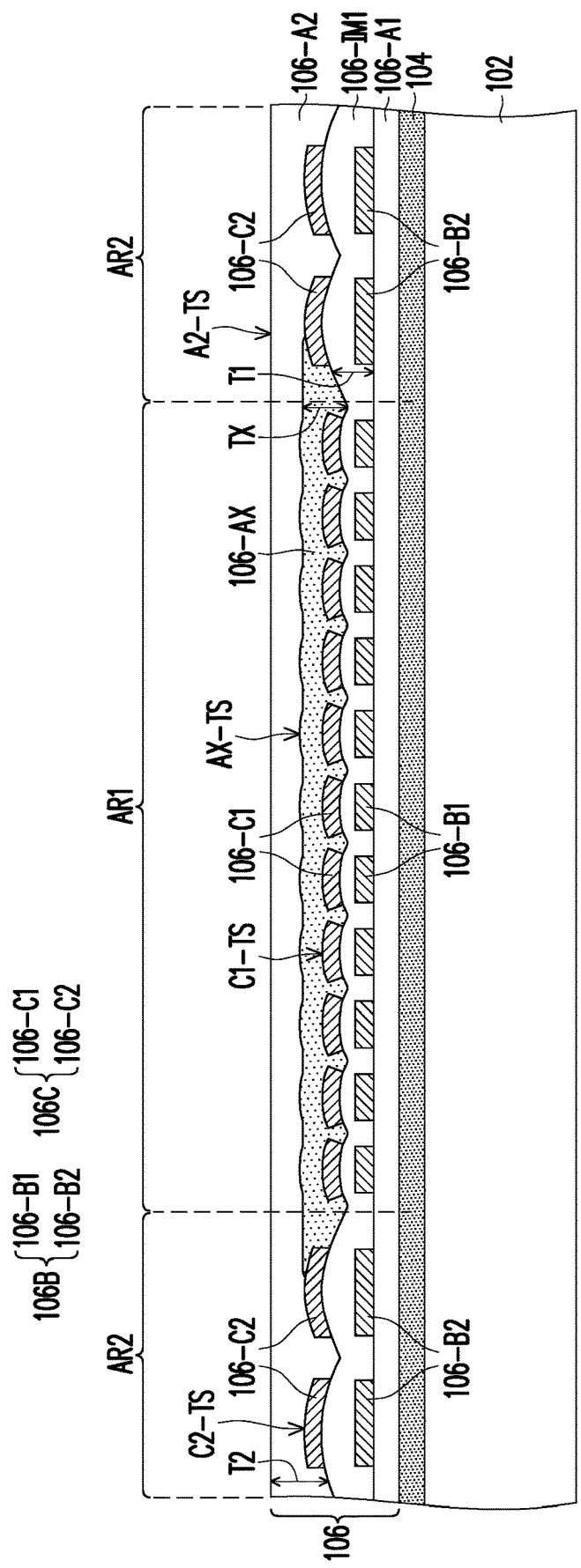

Referring to FIG. 6, in a subsequent step, a top dielectric layer 106-A2 is formed over the intermediate dielectric layer 106-IM1 and on the auxiliary dielectric portion 106-AX. For example, the auxiliary dielectric portion 106-AX is sandwiched between the intermediate dielectric layer 106-IM1 and the top dielectric layer 106-A2. In some embodiments, the top dielectric layer 106-A2 is covering and contacting the uneven top surface IM1-TS1 of the intermediate dielectric layer 106-IM1, and is covering and contacting a second portion of the top surface C2-TS (curved top surface) of the second conductive elements 106-C2. In some embodiments, the top dielectric layer 106-A2 has a substantially planar top surface A2-TS. In some embodiments, a thickness TX (e.g. maximum thickness) of the auxiliary dielectric portion 106-AX is smaller than a thickness T1 (e.g. maximum thickness) of the intermediate dielectric layer 106-IM1 (the first dielectric layer), and smaller than a thickness T2 (e.g. maximum thickness) of the top dielectric layer 106-A2. After forming the top dielectric layer 106-A2, a first redistribution layer 106 in accordance with some embodiments of the present disclosure is accomplished.

In some embodiments, the bottom dielectric layer 106-A1, the intermediate dielectric layer 106-IM1, the top dielectric layer 106-A2 and the auxiliary dielectric portion 106-AX may each be independently made from a dielectric material such as polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. Furthermore, these dielectric materials may be formed by suitable fabrication techniques such as spin-on coating, chemical vapor deposition (CVD), plasma-enhanced chemical vapor deposition (PECVD) or the like. The disclosure is not limited thereto.

In some embodiments, the first conductive layer 106B and the second conductive layer 106C may each be independently made from a conductive material formed by electroplating or deposition, such as aluminum, titanium, copper, nickel, tungsten, and/or alloys thereof, which may be patterned using a photolithography and etching process. For example, the first conductive layer 106B and the second conductive layer 106C are patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 7:
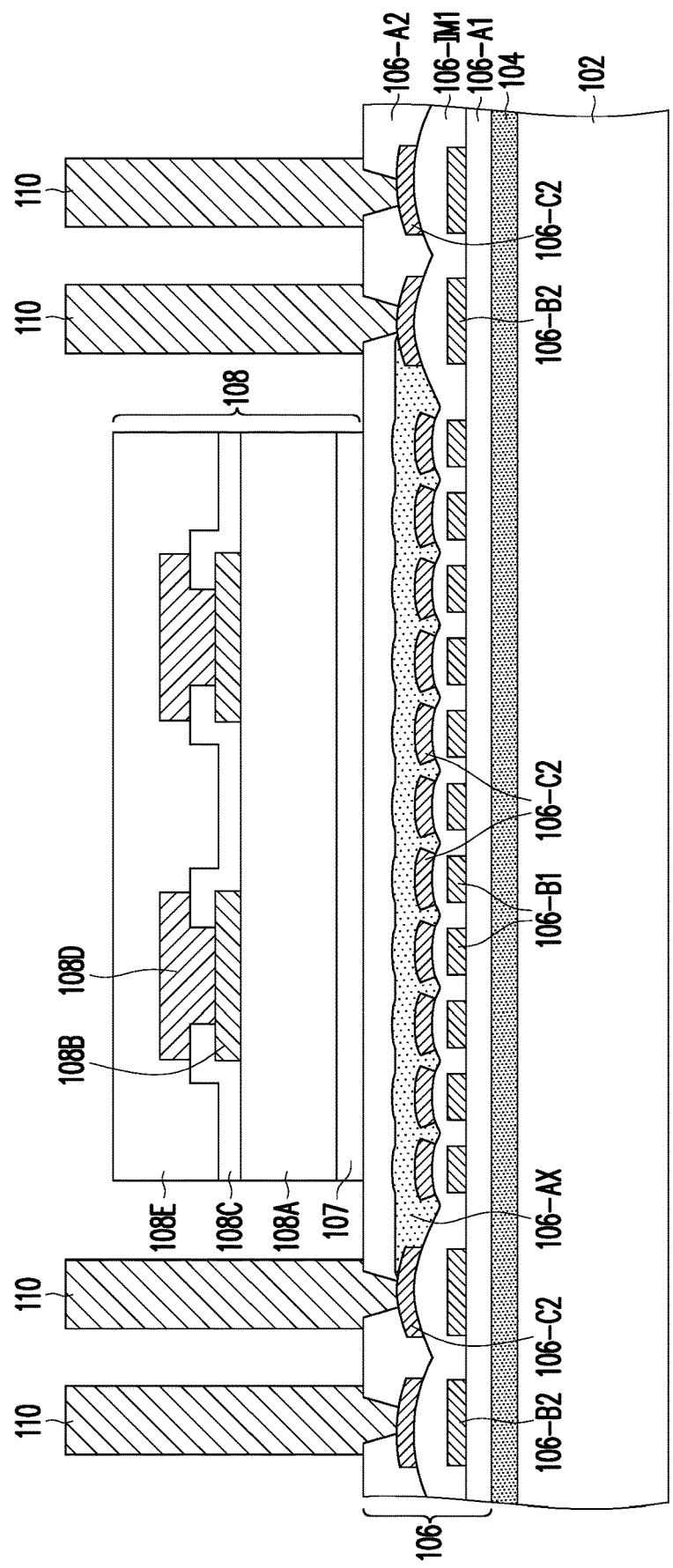

Referring to FIG. 7, after forming the first redistribution layer 106, a semiconductor die 108 is attached to the first redistribution layer 106 through a die attach film 107. For example, the semiconductor die 108 is disposed in the first region AR1 over the carrier 102. Furthermore, a plurality of through vias 110 is disposed on the second region AR2 on the first redistribution layer 106 and electrically connected to the second conductive elements 106-C2 of the second conductive layer 106C. In some embodiments, the through vias 110 surround the semiconductor die 108.

In some embodiments, the through vias 110 are through integrated fan-out ("InFO") vias. In one embodiment, the formation of the through vias 110 includes forming a mask pattern (not shown) with openings, then forming a metallic material (not shown) filling up the openings by electroplating or deposition, and removing the mask pattern to form the through vias 110 on the first redistribution layer 106. In certain embodiments, the through vias 110 fills into a via opening that reveals the second conductive elements 106-C2 of the first redistribution layer 106, so that the through vias 110 may be electrically connected to the first redistribution layer 106. In some embodiments, the material of the mask pattern may include a positive photo-resist or a negative photo-resist. In one embodiment, the material of the through vias 110 may include a metal material such as copper or copper alloys, or the like. However, the disclosure is not limited thereto.

In an alternative embodiment, the through vias 110 may be formed by forming a seed layer (not shown) on the first redistribution layer 106; forming the mask pattern with openings exposing portions of the seed layer; forming the metallic material on the exposed portions of the seed layer to form the through vias 110 by plating; removing the mask pattern; and then removing portions of the seed layer exposed by the through vias 110. For example, the seed layer may be a titanium/copper composited layer. For simplification, only four through vias 110 are illustrated in FIG. 7. However, it should be noted that the number of through vias 110 is not limited thereto, and can be selected based on requirement.

Furthermore, as illustrated in FIG. 7, at least one semiconductor die 108 is picked and placed on the first redistribution layer 106. In certain embodiments, the semiconductor die 108 has an active surface, and a backside surface opposite to the active surface 108-AS. For example, the backside surface of the semiconductor die 108 may be attached to the first redistribution layer 106 through the die attach film 107. By using the die attach film 107, a better adhesion between the semiconductor die 108 and the first redistribution layer 106 is ensured. In the exemplary embodiment, one semiconductor die 108 is illustrated. However, it should be noted that the number of semiconductor dies placed on the first redistribution layer 106 is not limited thereto, and this can be adjusted based on design requirement.

In the exemplary embodiment, the semiconductor die 108 includes a semiconductor substrate 108A, a plurality of conductive pads 108B, a passivation layer 108C, a plurality of conductive posts 108D, and a protection layer 108E. As illustrated in FIG. 7, the plurality of conductive pads 108B is disposed on the semiconductor substrate 108A. The passivation layer 108C is formed over the semiconductor substrate 108A and has openings that partially expose the conductive pads 108B on the semiconductor substrate 108A. The semiconductor substrate 108A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 108B may be aluminum pads, copper pads or other suitable metal pads. The passivation layer 108C may be a silicon oxide layer, a silicon nitride layer, a silicon oxynitride layer or a dielectric layer formed of any suitable dielectric materials. Furthermore, in some embodiments, a post-passivation layer (not shown) is optionally formed over the passivation layer 108C. The post-passivation layer covers the passivation layer 108C and has a plurality of contact openings. The conductive pads 108B are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 108D are formed on the conductive pads 108B by plating. In some embodiments, the protection layer 108E is formed on the passivation layer 108C or on the post passivation layer, and covering the conductive posts 108D so as to protect the conductive posts 108D.

In some embodiments, when more than one semiconductor die 108 are placed on the first redistribution layer 106, the semiconductor dies 108 may be arranged in an array, and when the semiconductor dies 108 are arranged in an array, the through vias 110 may be classified into groups. The number of the semiconductor dies 108 may correspond to the number of groups of the through vias 110. In some embodiments, the semiconductor die 108 may be picked and placed on the first redistribution layer 106 after the formation of the through vias 110. However, the disclosure is not limited thereto. In some alternative embodiments, the semiconductor die 108 may be picked and placed on the first redistribution layer 106 before the formation of the through vias 110.

In some embodiments, the semiconductor die 108 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 8:
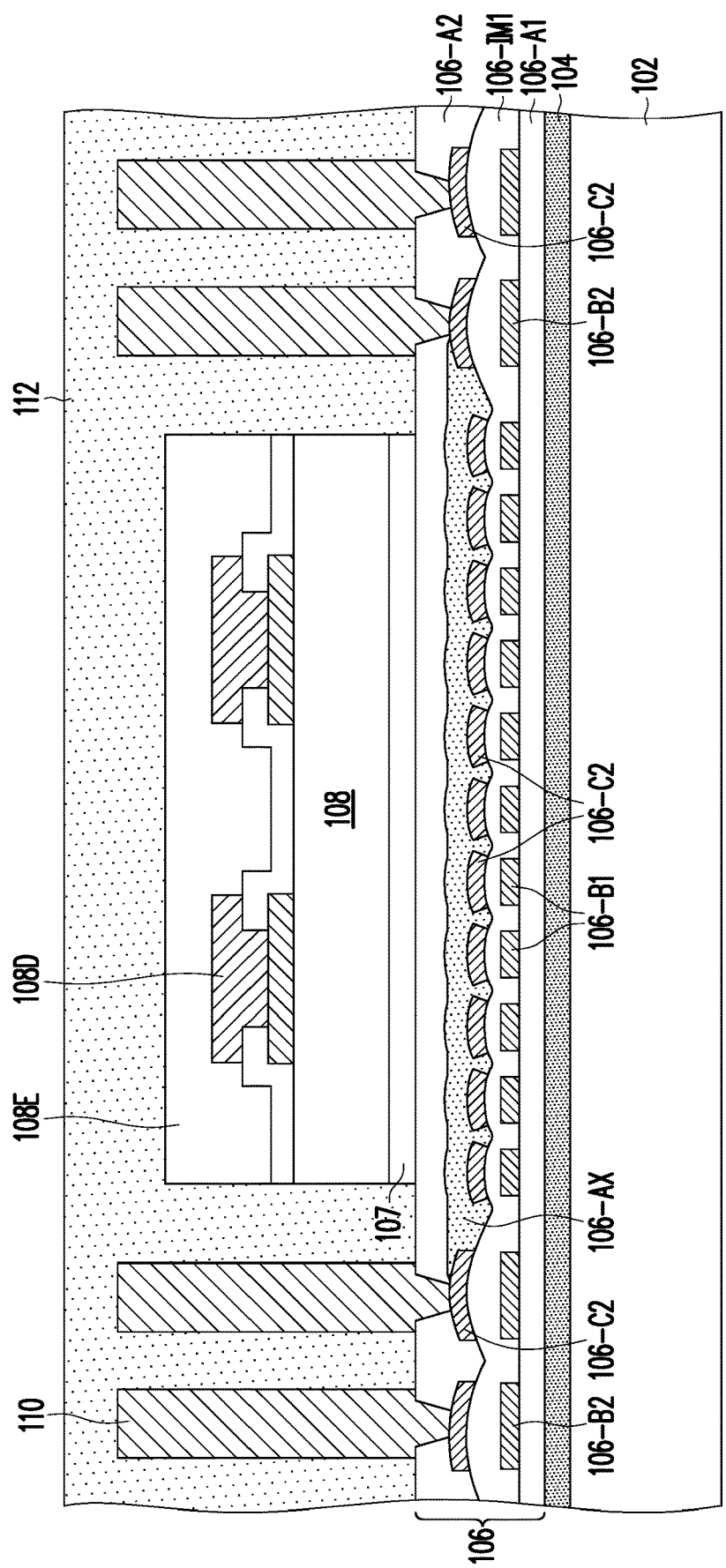

Referring to FIG. 8, in a subsequent step, an insulating material 112 is formed on the first redistribution layer 106 and over the semiconductor die 108. In some embodiments, the insulating material 112 is formed through, for example, a compression molding process, filling up the gaps between the semiconductor die 108 and the through vias 110 to encapsulate the semiconductor die 108. The insulating material 112 also fills up the gaps between adjacent through vias 110 to encapsulate the through vias 110. The conductive posts 108D and the protection layer 108E of the semiconductor die 108 are encapsulated by and well protected by the insulating material 112. In other words, the conductive posts 108D and the protection layer 108E of the semiconductor die 108 are not revealed and are well protected by the insulating material 112.

In some embodiments, the insulating material 112 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating material 112 may include an acceptable insulating encapsulation material. In some embodiments, the insulating material 112 may further include inorganic filler or inorganic compound (e.g. silica, clay, and so on) which can be added therein to optimize coefficient of thermal expansion (CTE) of the insulating material 112. The disclosure is not limited thereto.

Figure 9:
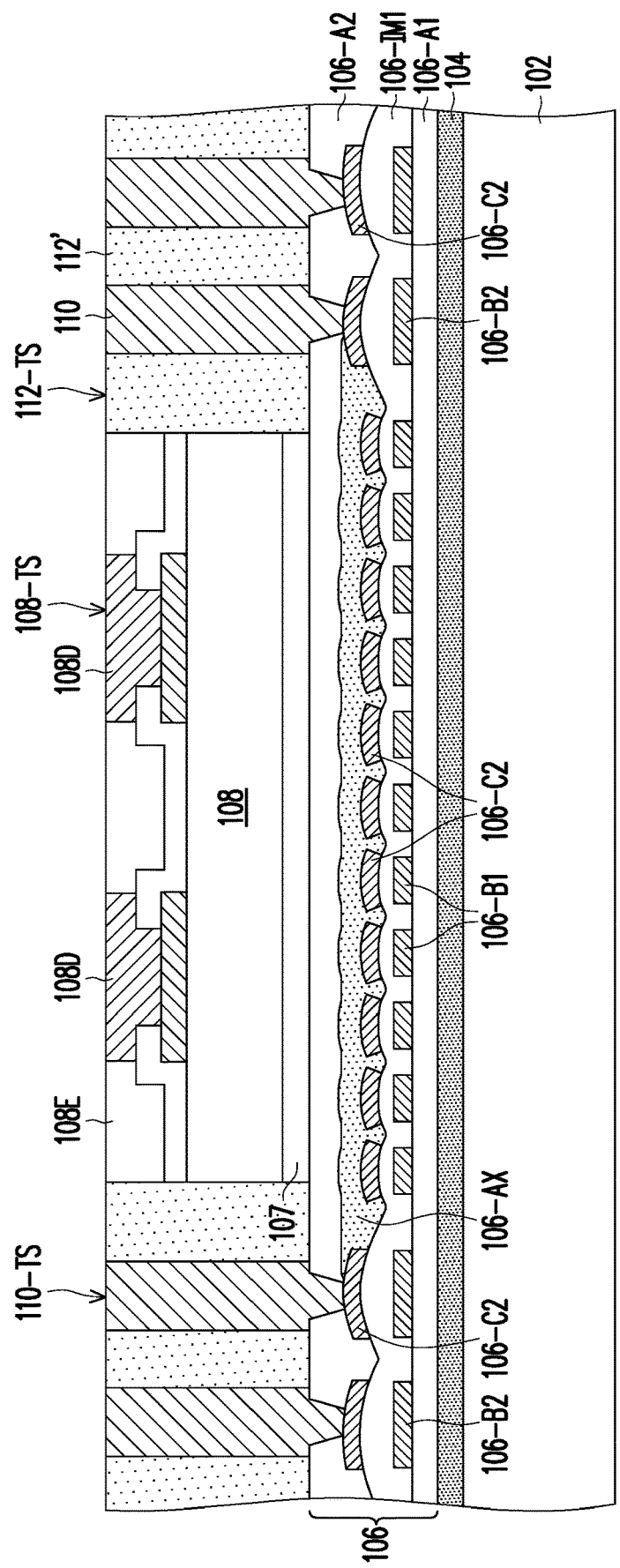

Referring to FIG. 9, in some embodiments, the insulating material 112 is partially removed to expose the conductive posts 108D and the through vias 110. In some embodiments, the insulating material 112 and the protection layer 108E are ground or polished by a planarization step. For example, the planarization step is performed through a mechanical grinding process and/or a chemical mechanical polishing (CMP) process until the top surfaces 108-TS of the conductive posts 108D are revealed. In some embodiments, the through vias 110 may be partially polished so that the top surfaces 110-TS of the through vias 110 are levelled with the top surfaces 108-TS of the conductive posts 108D, or levelled with the active surface of the semiconductor die 108. In other words, the conductive posts 108D and the through vias 110 may also be slightly grinded/polished.

In the illustrated embodiment, the insulating material 112 is polished to form an insulating encapsulant 112'. In some embodiments, the top surface 112-TS of the insulating encapsulant 112', the top surface 110-TS of the through vias 110, the top surface 108-TS of the conductive posts 108D, and the top surface of the polished protection layer 108E are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 10:
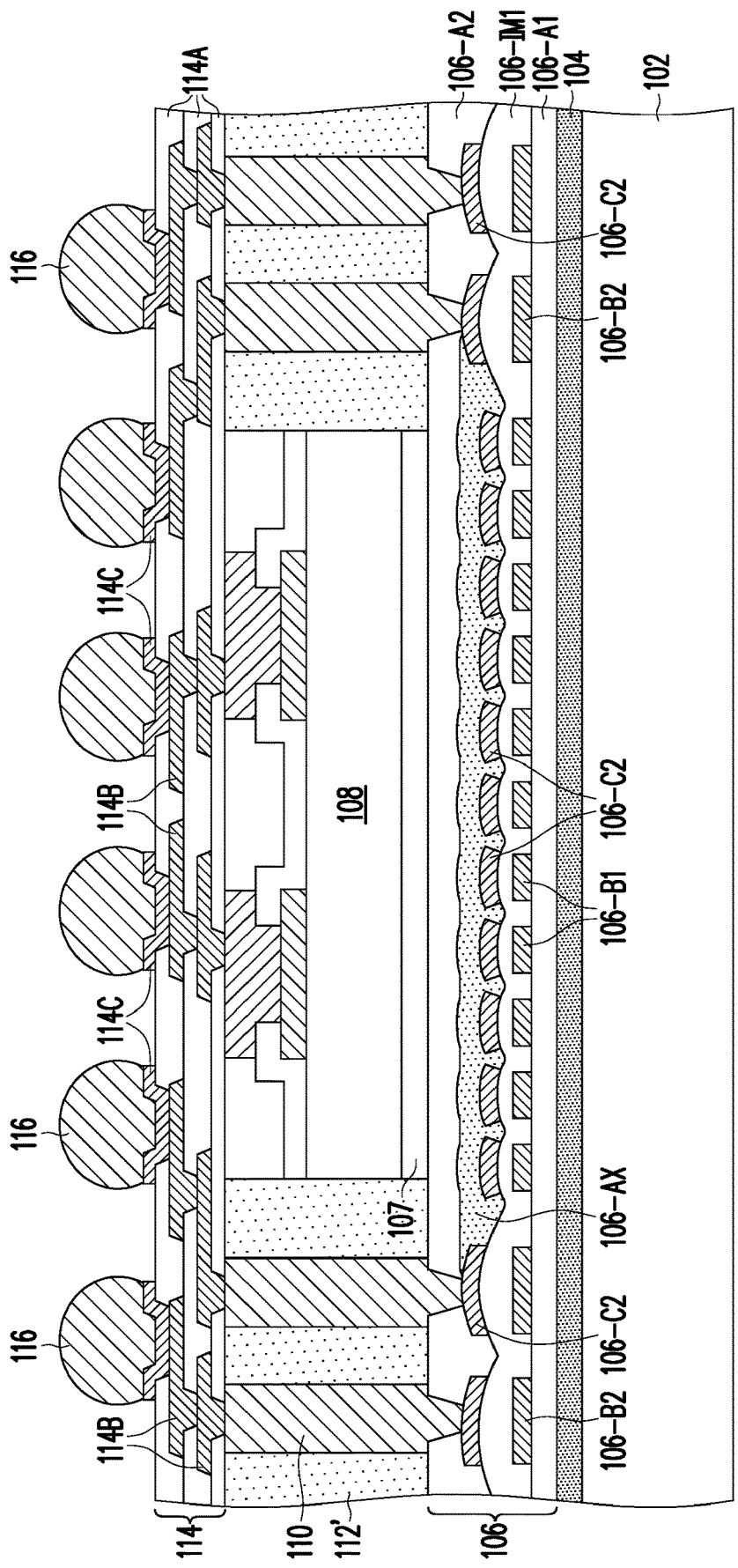

Referring to FIG. 10, after the planarization step, a second redistribution layer 114 (or top redistribution layer) is formed on the insulating encapsulant 112', the through vias 110 and the semiconductor die 108. For example, the second redistribution layer 114 is formed on the top surface 110-TS of the through vias 110, on the top surface 108-TS of the conductive posts 108D, and on the top surface 112-TS of the insulating encapsulant 112'. In some embodiments, the second redistribution layer 114 is electrically connected to the through vias 110, and is electrically connected to the semiconductor die 108 through the conductive posts 108D. In some embodiments, the semiconductor die 108 is electrically connected to the through vias 110 through the second redistribution layer 114.

In some embodiments, the formation of the second redistribution layer 114 includes sequentially forming one or more dielectric layers 114A, and one or more conductive layers 114B (or conductive patterns) in alternation. In certain embodiments, the conductive layers 114B are sandwiched between the dielectric layers 114A. Although only two layers of the conductive layers 114B and three layers of dielectric layers 114A are illustrated herein, however, the scope of the disclose is not limited by the embodiments of the disclosure. In other embodiments, the number of conductive layers 114B and the dielectric layers 114A may be adjusted based on product requirement. In some embodiments, the conductive layers 114B are electrically connected to the conductive posts 108D of the semiconductor die 108. Furthermore, the conductive layers 114B are electrically connected to the through vias 110.

In some embodiments, the materials of the dielectric layer 114A and the conductive layer 114B of the second redistribution layer 114 is similar to a material of the dielectric layers (106-A1, 106-IM1, 106-A2) and the conductive layers (106B, 106C) mentioned for the first redistribution layer 106. Therefore, the detailed description of the dielectric layer 114A and the conductive layer 114B will be omitted herein.

After forming the second redistribution layer 114, a plurality of conductive pads 114C may be disposed on an exposed top surface of the topmost layer of the conductive layers 114B for electrically connecting with conductive balls. In certain embodiments, the conductive pads 114C are for example, under-ball metallurgy (UBM) patterns used for ball mount. As shown in FIG. 10, the conductive pads 114C are formed on and electrically connected to the second redistribution layer 114. In some embodiments, the materials of the conductive pads 114C may include copper, nickel, titanium, tungsten, or alloys thereof or the like, and may be formed by an electroplating process, for example. The number of conductive pads 114C are not limited in this disclosure, and may be selected based on the design layout. In some alternative embodiments, the conductive pads 114C may be omitted. In other words, conductive balls 116 formed in subsequent steps may be directly disposed on the second redistribution layer 114.

After forming the conductive pads 114C, a plurality of conductive balls 116 is disposed on the conductive pads 114C and over the second redistribution layer 114. In some embodiments, the conductive balls 116 may be disposed on the conductive pads 114C by a ball placement process or reflow process. In some embodiments, the conductive balls 116 are, for example, solder balls or ball grid array (BGA) balls. In some embodiments, the conductive balls 116 are connected to the second redistribution layer 114 through the conductive pads 114C. In certain embodiments, some of the conductive balls 116 may be electrically connected to the semiconductor die 108 through the second redistribution layer 114. Furthermore, some of the conductive balls 116 may be electrically connected to the through vias 110 through the second redistribution layer 114. The number of the conductive balls 116 is not limited to the disclosure, and may be designated and selected based on the number of the conductive pads 114C. In some alternative embodiments, an integrated passive device (IPD) (not shown) may optionally be disposed on the second redistribution layer 114 and electrically connected to the second redistribution layer 114.

Figure 11:
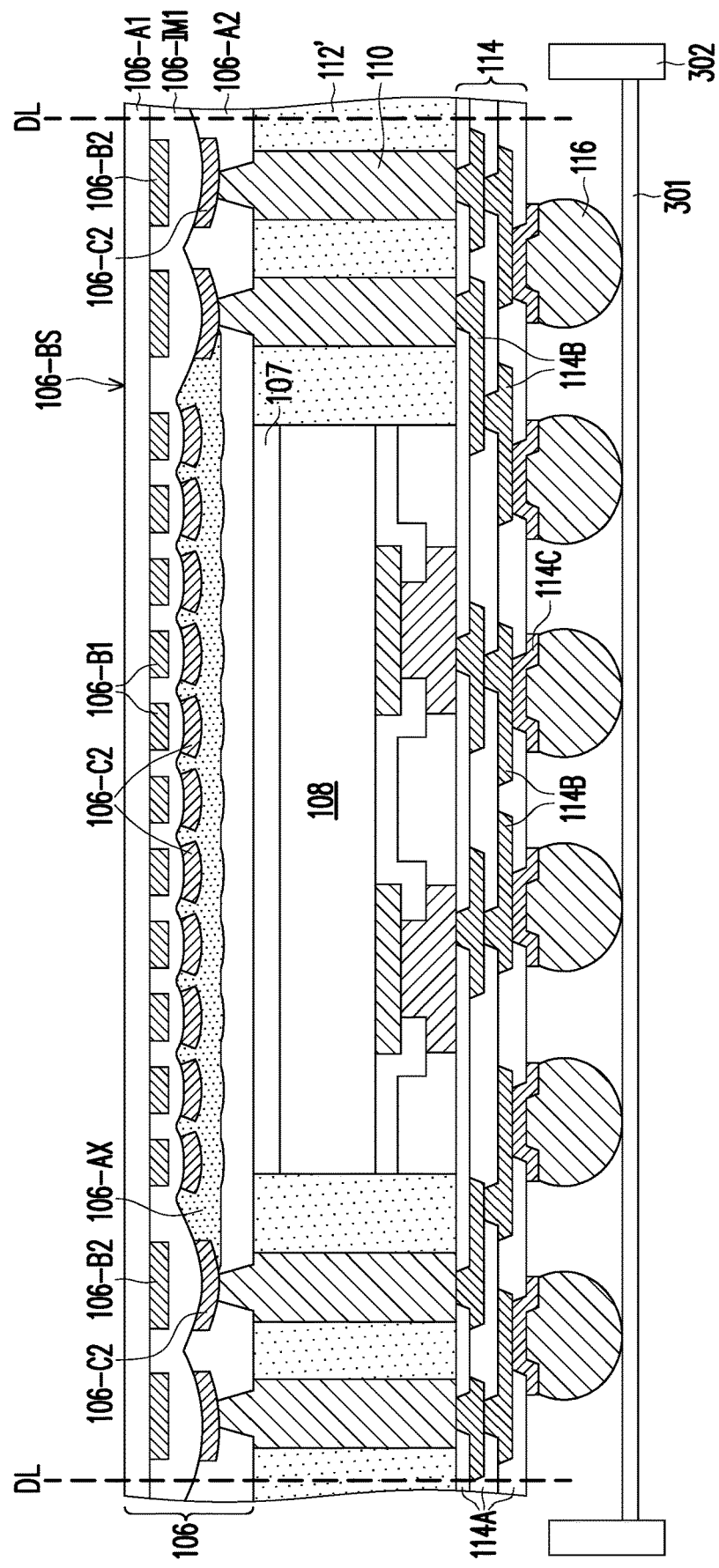

Referring to FIG. 11, after forming the second redistribution layer 114 and placing the conductive balls 116 thereon, the structure shown in FIG. 10 may be turned upside down and attached to a tape 301 (e.g., a dicing tape) supported by a frame 302. As illustrated in FIG. 11, the carrier 102 is debonded and is separated from the first redistribution layer 106. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape 301 is used to secure the package structure before de-bonding the carrier 102 and the debond layer 104. After the de-bonding process, a backside surface 106-BS of the first redistribution layer 106 is revealed or exposed. In certain embodiments, the bottom dielectric layer 106-A1 of the first redistribution layer 106 is revealed or exposed.

Figure 12:
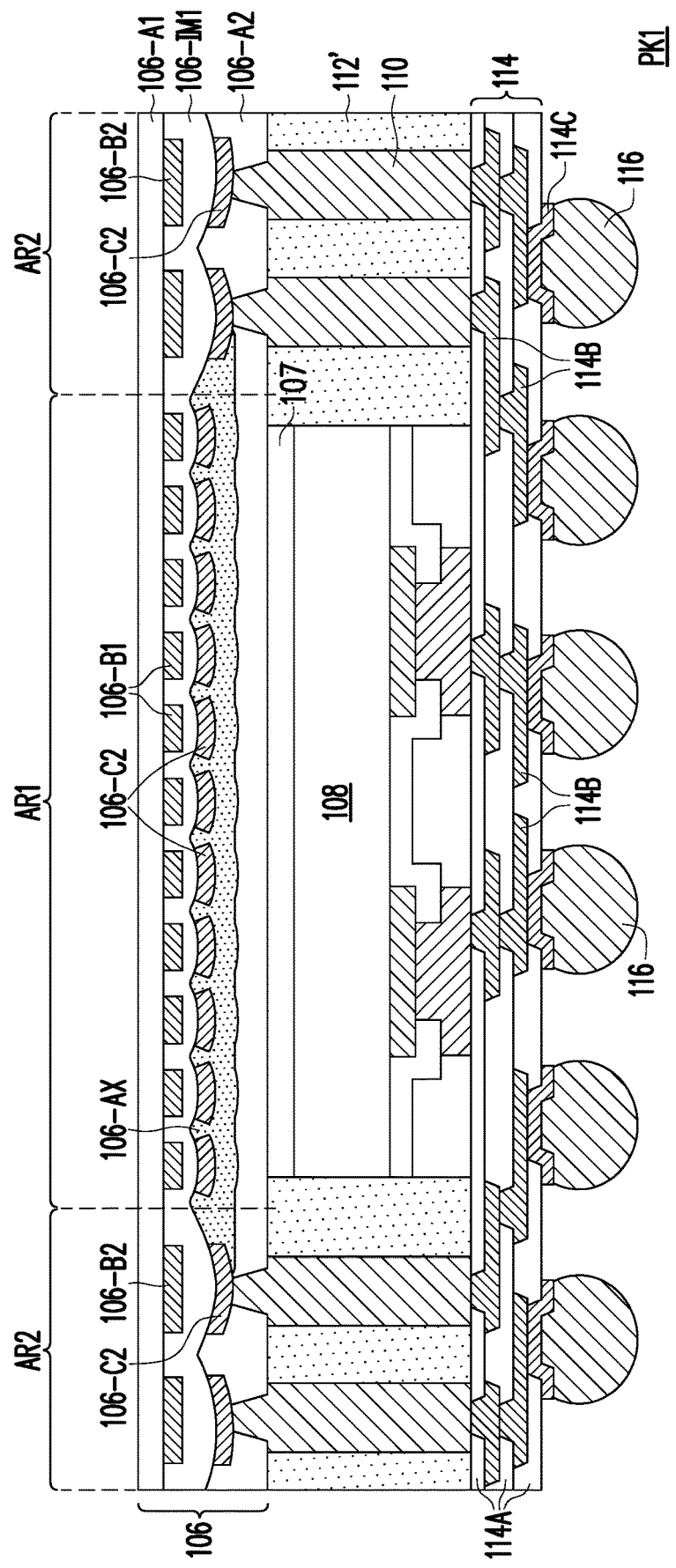

Referring to FIG. 12, after the de-bonding process, a dicing process is performed along the dicing lines DL (shown in FIG. 11) to cut the whole wafer structure (cutting through the insulating encapsulant 112', the first redistribution layers 106 and the second redistribution layer 114) into a plurality of package structures PK1. In the exemplary embodiment, the dicing process is a wafer dicing process including mechanical blade sawing or laser cutting. In a subsequent process, the separated package structures PK1 may for example, be disposed onto a circuit substrate or onto other components based on requirements. Up to here, the package structure PK1 in accordance with some embodiments of the present disclosure is accomplished. In the package structure PK1, since at least one auxiliary dielectric portion 106-AX is formed in the first redistribution layer 106, the first redistribution layer 106 may have a planarized top surface, and a void issue during attachment of semiconductor dies onto the first redistribution layer 106 may be prevented. As such, the package structure PK1 may have improved reliability.

Figure 13:
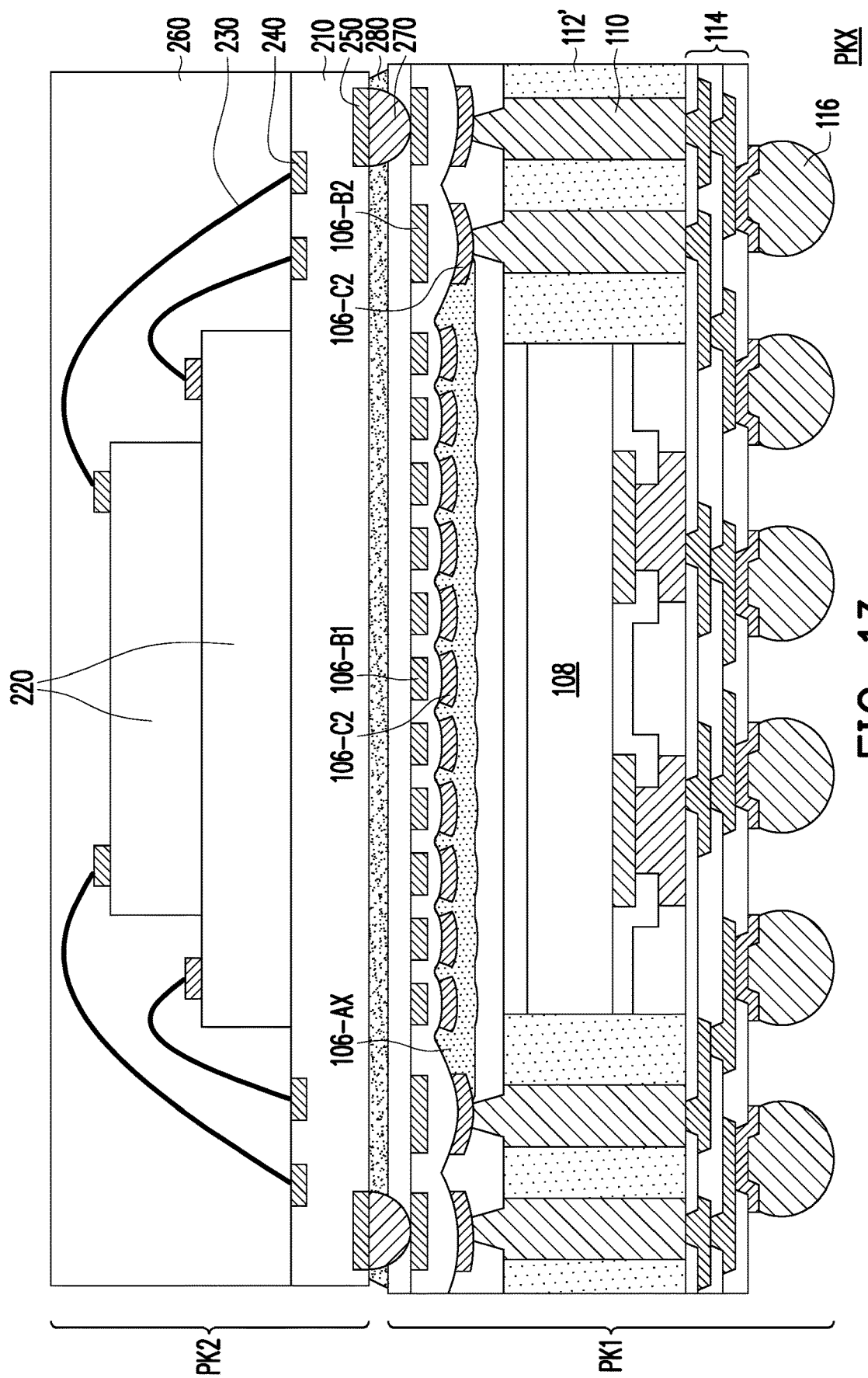
FIG. 13 is a schematic sectional view of a package structure according to some exemplary embodiments of the present disclosure.

FIG. 13 is a schematic sectional view of a package structure according to some exemplary embodiments of the present disclosure. Referring to FIG. 13, after fabricating a first package, such as the package structure PK1 illustrated in FIG. 12, a second package PK2 may be stacked on the package structure PK1 (first package) so as to form a package structure PKX or a package-on-package (PoP) structure. As illustrated in FIG. 13, the second package PK2 is electrically connected to the second conductive elements 106-B2 of the package structure PK1 (first package).

In some embodiments, the second package PK2 has a substrate 210, a plurality of semiconductor chips 220 mounted on one surface (e.g. top surface) of the substrate 210 and stacked on top of one another. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the second package PK2 are electrically connected to conductive balls 270 (or conductive bumps). Furthermore, the conductive balls 270 are electrically connected to the second conductive elements 106-C2 of the first redistribution layer 106 in the package structure PK1 (first package). In some embodiments, an underfill structure 280 is further provided to fill in the spaces between the conductive balls 270 to protect the conductive balls 270.

After stacking the second package PK2 on the package structure PK1 (first package) and providing electrical connection therebetween, a package structure PKX or a package-on-package (PoP) structure can be fabricated. For example, in the package structure PKX, the semiconductor chips 220 are disposed on the first redistribution layer 106 and electrically connected to the second conductive elements 106-C2. Furthermore, the semiconductor chips 220 and the semiconductor die 108 are located on two opposing surfaces of the first redistribution layer 106.

Figure 14B:
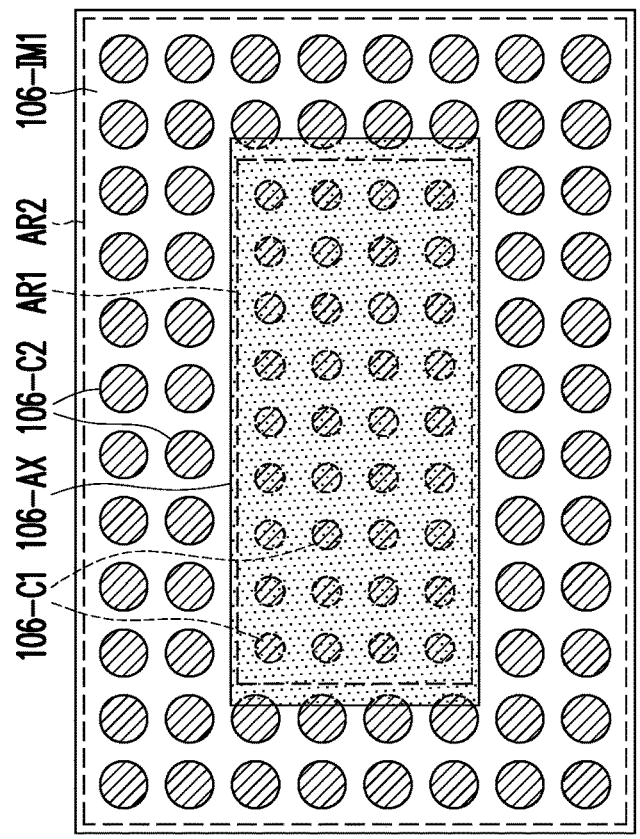
FIG. 14A and FIG. 14B are schematic top views of intermediate stages in a method of fabricating a package structure according to some exemplary embodiments of the present disclosure.
Figure 14A:
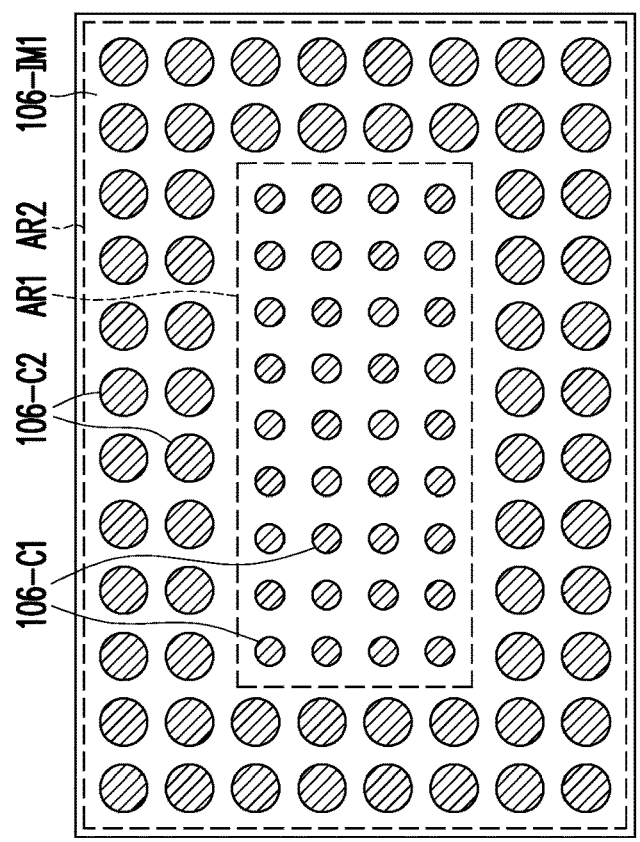

FIG. 14A and FIG. 14B are schematic top views of intermediate stages in a method of fabricating a package structure according to some exemplary embodiments of the present disclosure. For example, in one embodiment, FIG. 14A may correspond to a top view of the structure shown in FIG. 4 at an intermediate stage of fabricating the package structure PK1. As illustrated in FIG. 14A, in some embodiments, the first region AR1 including the first conductive elements 106-C1 is surrounded by the second region AR2 including the second conductive elements 106-C2. In the exemplary embodiment, the intermediate dielectric layer 106-IM1 includes one recessed portion RC1 (as shown in FIG. 4) corresponding to the one first region AR1. In other words, the first conductive elements 106-C1 are located in the recessed portion RC1 within the first region AR1. Referring to FIG. 14B, which may correspond to a top view of the structure shown in FIG. 5, in a subsequent step, one auxiliary dielectric portion 106-AX is formed over the intermediate dielectric layer 106-IM1. The auxiliary dielectric portion 106-AX may cover the first region AR1 while extending towards the second region AR1 to partially cover the second conductive elements 106-C2.

Figure 15:
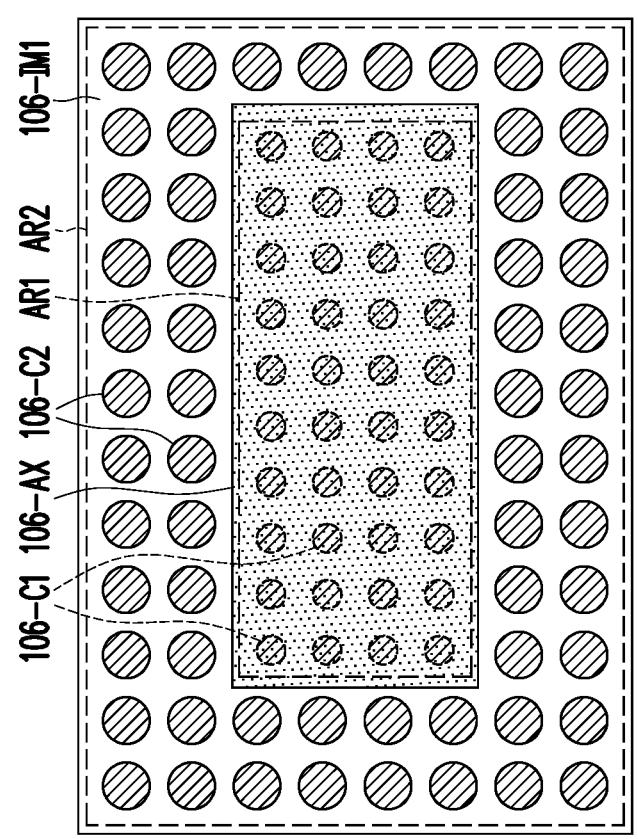
FIG. 15 is a top view of an intermediate stage in a method of fabricating a package structure according to some exemplary embodiments of the present disclosure.

FIG. 15 is a top view of an intermediate stage in a method of fabricating a package structure according to some exemplary embodiments of the present disclosure. For example, in another embodiment, FIG. 15 may correspond to a top view of the structure shown in FIG. 5 at an intermediate stage of fabricating the package structure PK1. In the embodiment shown in FIG. 14A to FIG. 14B, the first region AR1 including the first conductive elements 106-C1 is designed so that an area of the first region AR1 substantially corresponds to a die attaching area (area located below semiconductor die 108). However, the disclosure is not limited thereto. For example, referring to FIG. 15, the first region AR1 including the first conductive elements 106-C1 are designed to occupy a greater surface area than the first region AR1 shown in FIG. 14B. As such, when a semiconductor die 108 is disposed over the first redistribution layer 106 (as shown in FIG. 7), an area of the first region AR1 may extend beyond the die attaching area. In other words, some of the first conductive elements 106-C1 and the auxiliary dielectric portion 106-AX are non-overlapped with the semiconductor die 108 disposed in a later step.

Figure 16:
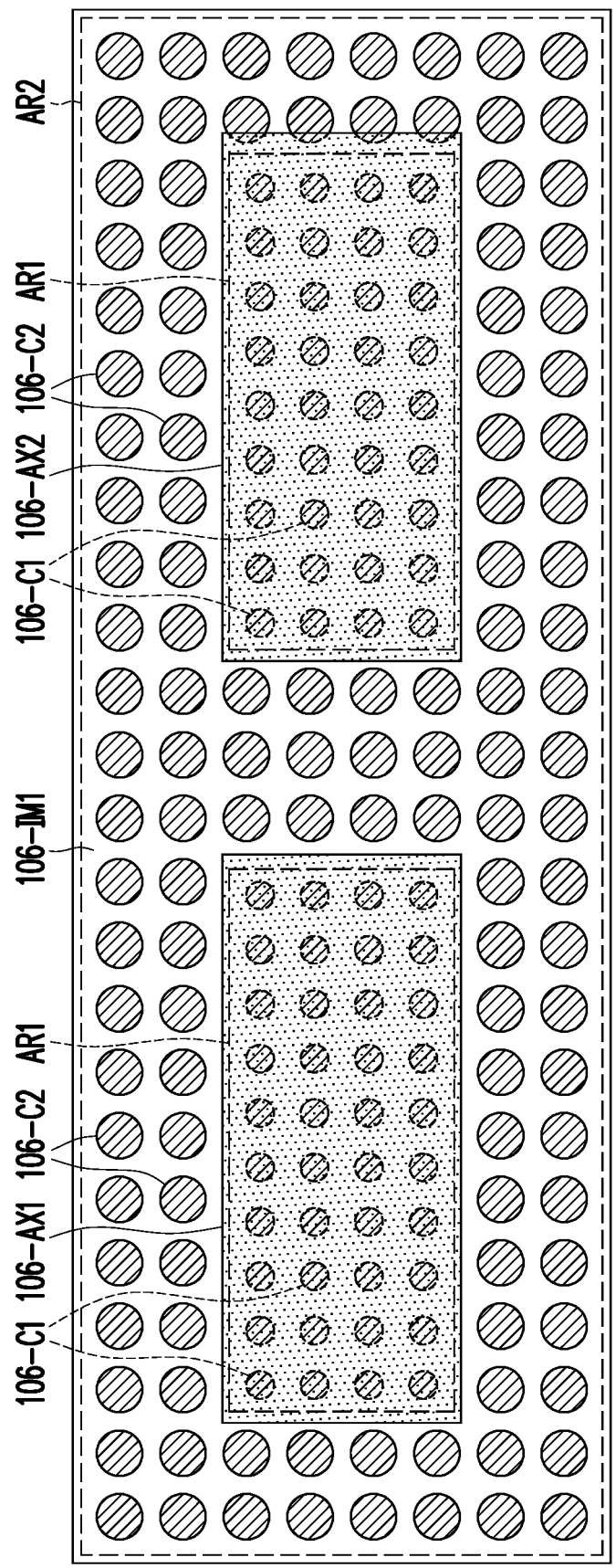
FIG. 16 is a top view of an intermediate stage in a method of fabricating a package structure according to some other exemplary embodiments of the present disclosure.

FIG. 16 is a top view of an intermediate stage in a method of fabricating a package structure according to some other exemplary embodiments of the present disclosure. For example, in another embodiment, FIG. 16 may correspond to a top view of the structure shown in FIG. 5 at an intermediate stage of fabricating the package structure PK1 (e.g. FIG. 5 illustrates a partial cross section). In the previous embodiments, although one first region AR1 and one auxiliary dielectric portion 106-AX is illustrated, it is noted that the disclosure is not limited thereto. As illustrated in FIG. 16, in some embodiments, there are two auxiliary dielectric portions 106-AX1 and 106-AX2 that are respectively covering the two first regions AR1. For example, the two auxiliary dielectric portions 106-AX1, 106-AX2 may be disposed in between the intermediate dielectric layer 106-IM1 and the top dielectric layer 106-A2 in the same way as shown in FIG. 6. In some embodiments, the auxiliary dielectric portion 106-AX1 is physically separated from the auxiliary dielectric portion 106-AX2. The auxiliary dielectric portion 106-AX1 may be covering the first conductive elements 106-C1 while being separated from the second conductive elements 106-C2. Furthermore, the auxiliary dielectric portion 106-AX2 may be covering the first conductive elements 106-C1, and extend towards the second region AR2 to partially cover some of the second conductive elements 106-C2.

Figure 17:
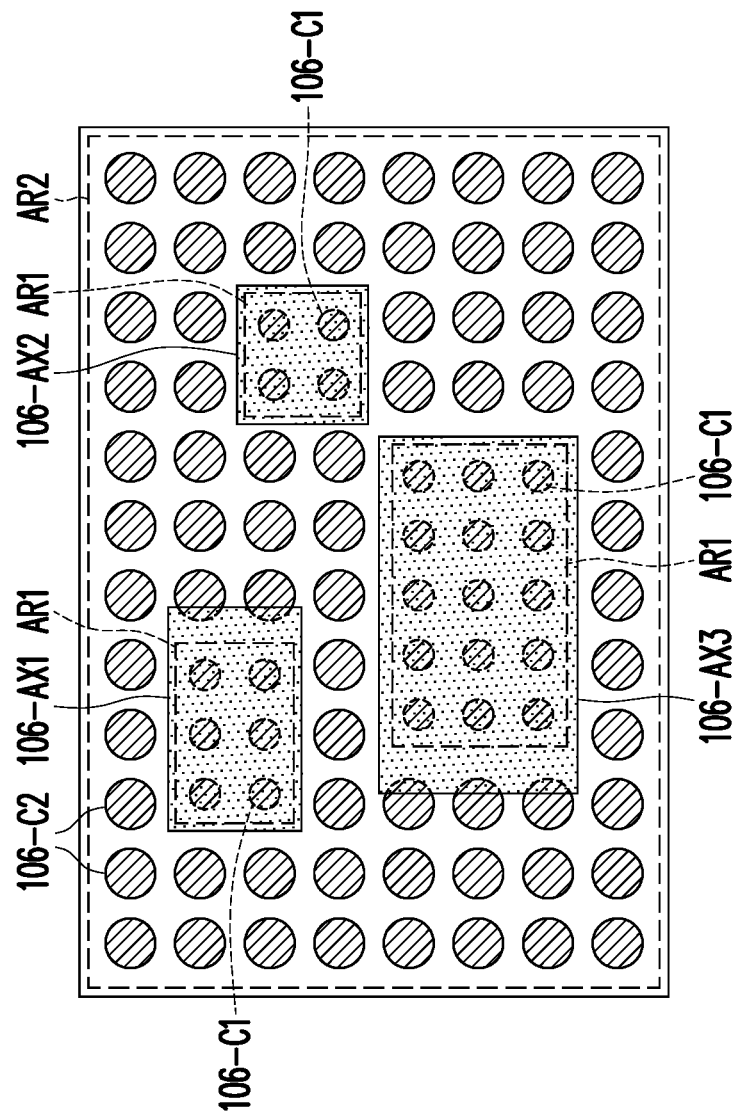
FIG. 17 is a top view of an intermediate stage in a method of fabricating a package structure according to some other exemplary embodiments of the present disclosure.

FIG. 17 is a top view of an intermediate stage in a method of fabricating a package structure according to some other exemplary embodiments of the present disclosure. For example, in another embodiment, FIG. 17 may correspond to a top view of the structure shown in FIG. 5 at an intermediate stage of fabricating the package structure PK1 (e.g. FIG. 5 illustrates a partial cross section). In the previous embodiments, one or two auxiliary dielectric portions (106-AX, 106-AX1, 106-AX1) is illustrated, however, it is noted that the disclosure is not limited thereto. As illustrated in FIG. 17, in some embodiments, there are three auxiliary dielectric portions 106-AX1, 106-AX2 and 106-AX3 that are randomly distributed over the intermediate dielectric layer 106-IM1. For example, the three auxiliary dielectric portions 106-AX1, 106-AX2, 106-AX3 may be disposed in between the intermediate dielectric layer 106-IM1 and the top dielectric layer 106-A2 in the same way as shown in FIG. 6. In some embodiments, the auxiliary dielectric portion 106-AX1, the auxiliary dielectric portion 106-AX2, and the auxiliary dielectric portion 106-AX3 are physically separated from one another.

As illustrated in FIG. 17, the auxiliary dielectric portion 106-AX1 may be covering the first conductive elements 106-C1, and extend towards the second region AR2 to partially cover some of the second conductive elements 106-C2. The auxiliary dielectric portion 106-AX2 may be covering the first conductive elements 106-C1, while being separated from the second conductive elements 106-C2. Furthermore, the auxiliary dielectric portion 106-AX3 may be covering the first conductive elements 106-C1, and extend towards the second region AR2 to partially cover some of the second conductive elements 106-C2. From such embodiment, it should be noted that the number and design of the auxiliary dielectric portions are not particularly limited, and the number of the auxiliary dielectric portions may directly correspond to the arrangement of the first conductive elements 106-C1 in separate regions.

Figure 18:
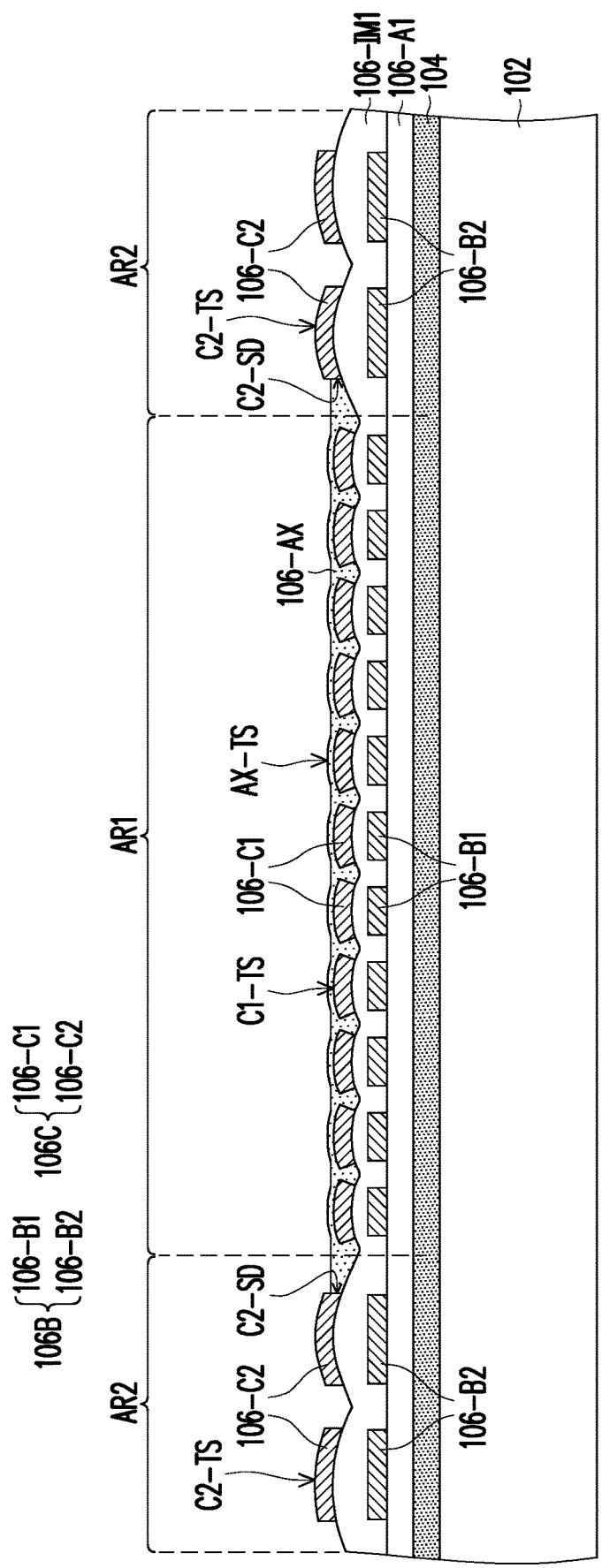
FIG. 18 and FIG. 19 are schematic sectional views of various stages in a method of fabricating a package structure according to some other exemplary embodiments of the present disclosure.
Figure 19:
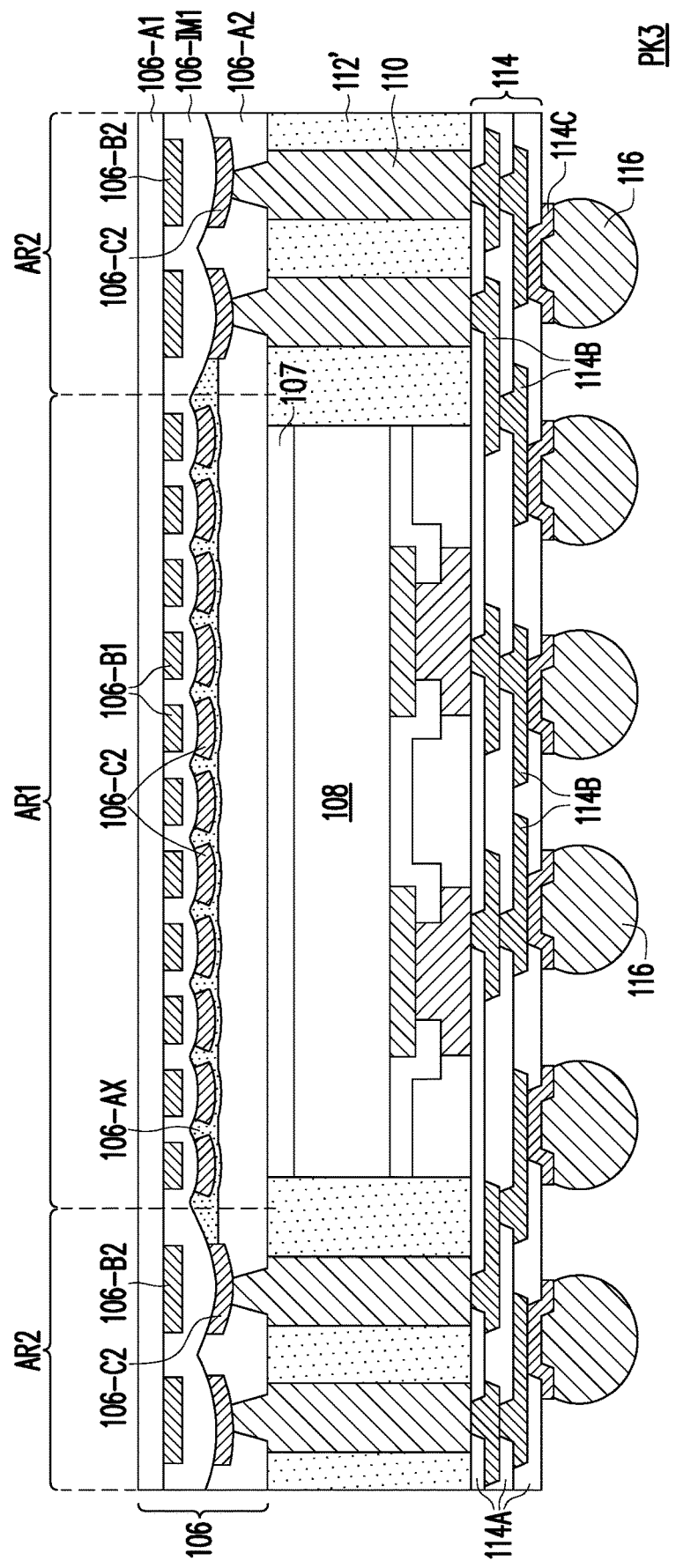

FIG. 18 and FIG. 19 are schematic sectional views of various stages in a method of fabricating a package structure according to some other exemplary embodiments of the present disclosure. The method illustrated in FIG. 18 and FIG. 19 is similar to the method illustrated in FIG. 1 to FIG. 12. Therefore, the same reference numerals are used to refer to the same or liked parts, and its detailed description will be omitted herein. The difference between the embodiments is in the design of the auxiliary dielectric portion 106-AX. As illustrated in FIG. 18, after forming the second conductive layer 106C on the intermediate dielectric layer 106-IM1 in the same way as described in FIG. 1 to FIG. 4, an auxiliary dielectric portion 106-AX is formed over the intermediate dielectric layer 106-IM1 to cover and contact the first conductive elements 106-C1. Referring to FIG. 18, in some embodiments, the auxiliary dielectric portion 106-AX is partially covering the side surface C2-SD of the second conductive elements 106-C2, while revealing the top surface C2-TS of the second conductive elements 106-C2.

Referring to FIG. 19, the same steps described in FIG. 6 to FIG. 12 may be performed to complete the formation of the first redistribution layer 106, the attachment of the semiconductor die 108, the formation of the through vias 110, the formation of the second redistribution layer 114, and the formation of the conductive balls 116 on the second redistribution layer 114. As such, a package structure PK3 in accordance with some embodiments of the present disclosure is accomplished. In the package structure PK3, since at least one auxiliary dielectric portion 106-AX is formed in the first redistribution layer 106, the first redistribution layer 106 may have a planarized top surface, and a void issue during attachment of semiconductor dies onto the first redistribution layer 106 may be prevented. As such, the package structure PK3 may have improved reliability.

Figure 20:
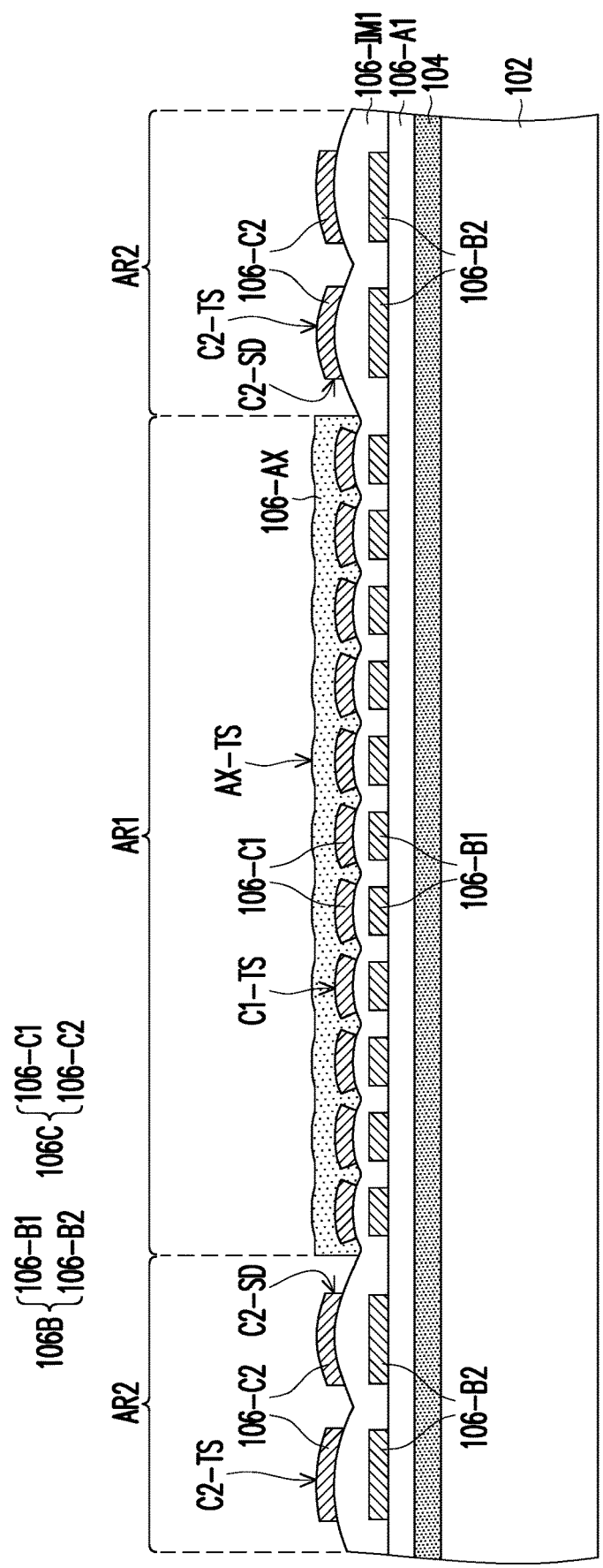
FIG. 20 to FIG. 23 are schematic sectional views of various stages in a method of fabricating a package structure according to some other exemplary embodiments of the present disclosure.

FIG. 20 to FIG. 23 are schematic sectional views of various stages in a method of fabricating a package structure according to some other exemplary embodiments of the present disclosure. The method illustrated in FIG. 20 to FIG. 23 is similar to the method illustrated in FIG. 1 to FIG. 12. Therefore, the same reference numerals are used to refer to the same or liked parts, and its detailed description will be omitted herein. The difference between the embodiments is in the design of the auxiliary dielectric portion 106-AX. In the previous embodiment, the auxiliary dielectric portion 106-AX may extend from the first region AR1 to the second region AR2. However, the disclosure is not limited thereto. As illustrated in FIG. 20, in some embodiments, after forming the second conductive layer 106C on the intermediate dielectric layer 106-IM1 in the same way as described in FIG. 1 to FIG. 4, an auxiliary dielectric portion 106-AX is formed over the intermediate dielectric layer 106-IM1 to cover and contact the first conductive elements 106-C1. For example, the auxiliary dielectric portion 106-AX is located within the first region AR1 and does not extend towards the second region AR2. In other words, the auxiliary dielectric portion 106-AX is not contacting the second conductive elements 106-C2. In some embodiments, the auxiliary dielectric portion 106-AX may have an increased height, whereby the top surface AX-TS of the auxiliary dielectric portion 106-AX is higher than the top surface C2-TS of the second conductive elements 106-C2.

Figure 21:
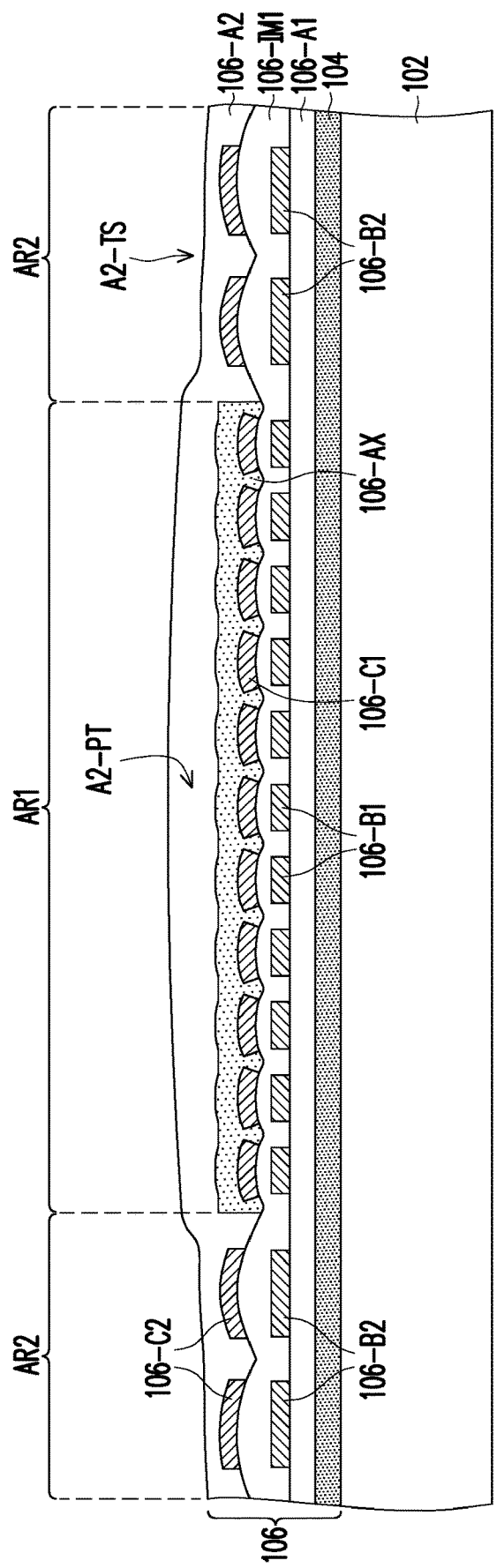
Figure 22:
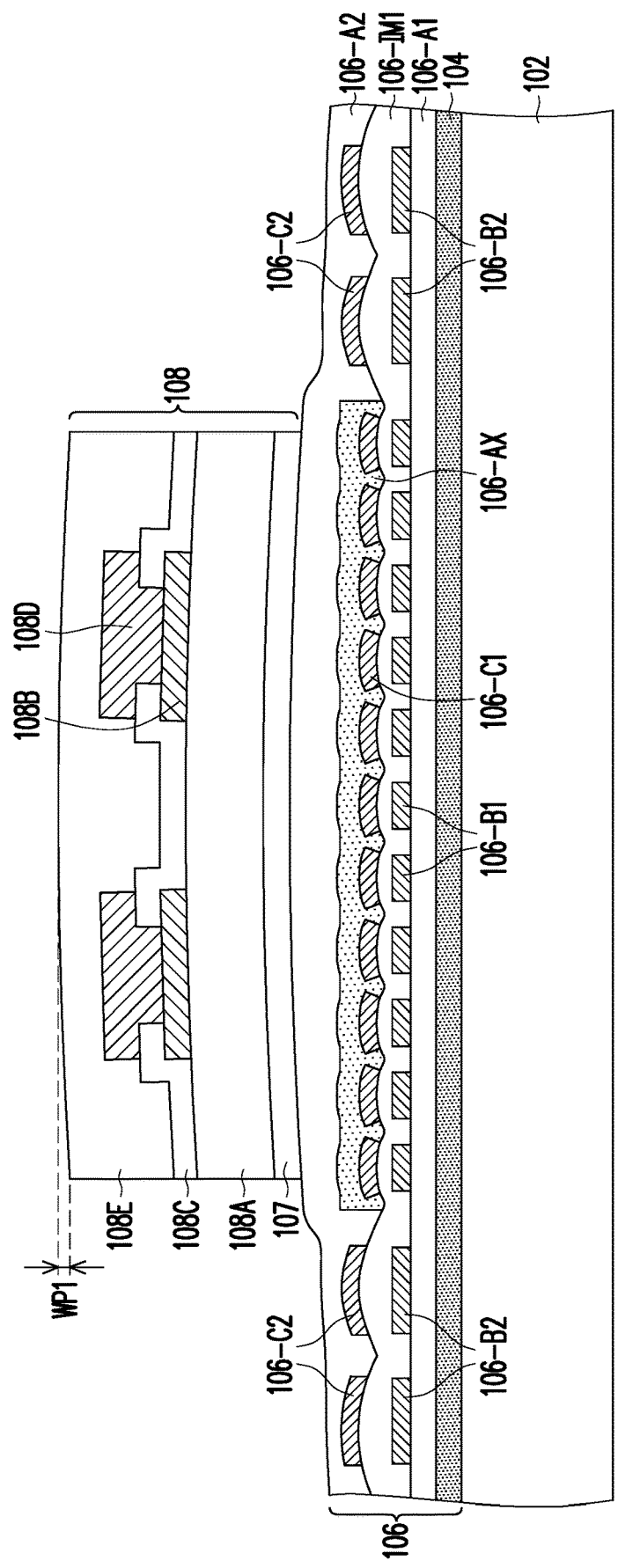

Referring to FIG. 21, due to the increased height of the auxiliary dielectric portion 106-AX, when forming a top dielectric layer 106-A2 over the intermediate dielectric layer 106-IM1 and on the auxiliary dielectric portion 106-AX, the top dielectric layer 106-A2 will be formed with a protruding portion A2-PT protruding from the top surface A2-TS in the first region AR1. Referring to FIG. 22, in such an embodiment, a semiconductor die 108 having a warpage may be suitably disposed over the protruding portion A2-PT of the top dielectric layer 106-A2. For example, the warpage of the semiconductor die 108 is defined by having a maximum height difference WP1 at the top surface of the semiconductor die 108 measured from a center of the semiconductor die 108 to a boundary of the semiconductor die 108. In some embodiments, the maximum height difference WP1 may substantially correspond to a protruding height of the protruding portion A2-PT, so that the semiconductor die 108 may attached to the first redistribution layer 106 without any voids.

Figure 23:
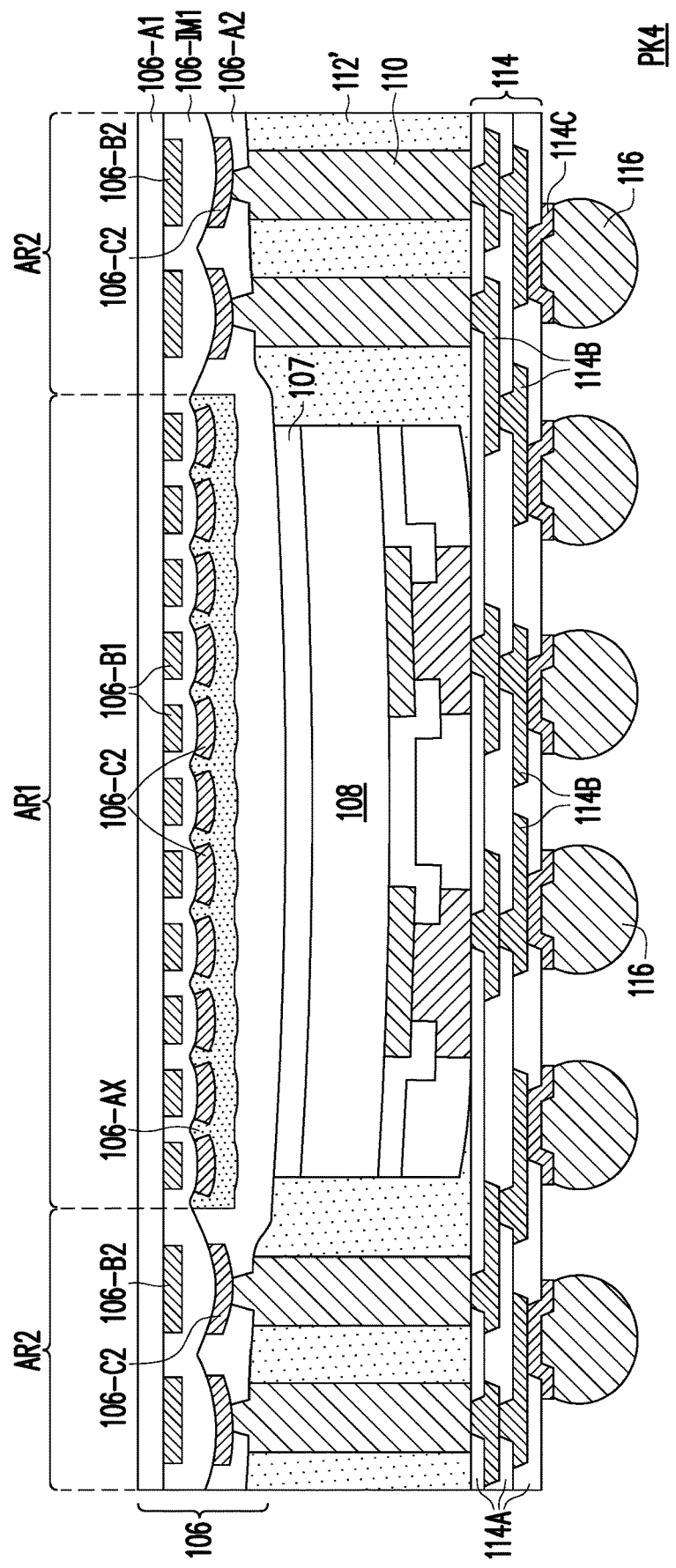

Referring to FIG. 23, the same steps described in FIG. 7 to FIG. 12 may be performed to complete the formation of the through vias 110, the formation of the second redistribution layer 114, and the formation of the conductive balls 116 on the second redistribution layer 114. As such, a package structure PK4 in accordance with some embodiments of the present disclosure is accomplished. In the package structure PK4, since at least one auxiliary dielectric portion 106-AX is formed in the first redistribution layer 106 with an increased height, the first redistribution layer 106 may include a protruding portion A2-PT that is suitable for disposing semiconductor dies having a certain warpage thereon. As such, a void issue during attachment of semiconductor dies onto the first redistribution layer 106 may be prevented, and the package structure PK4 may have improved reliability.

Figure 24:
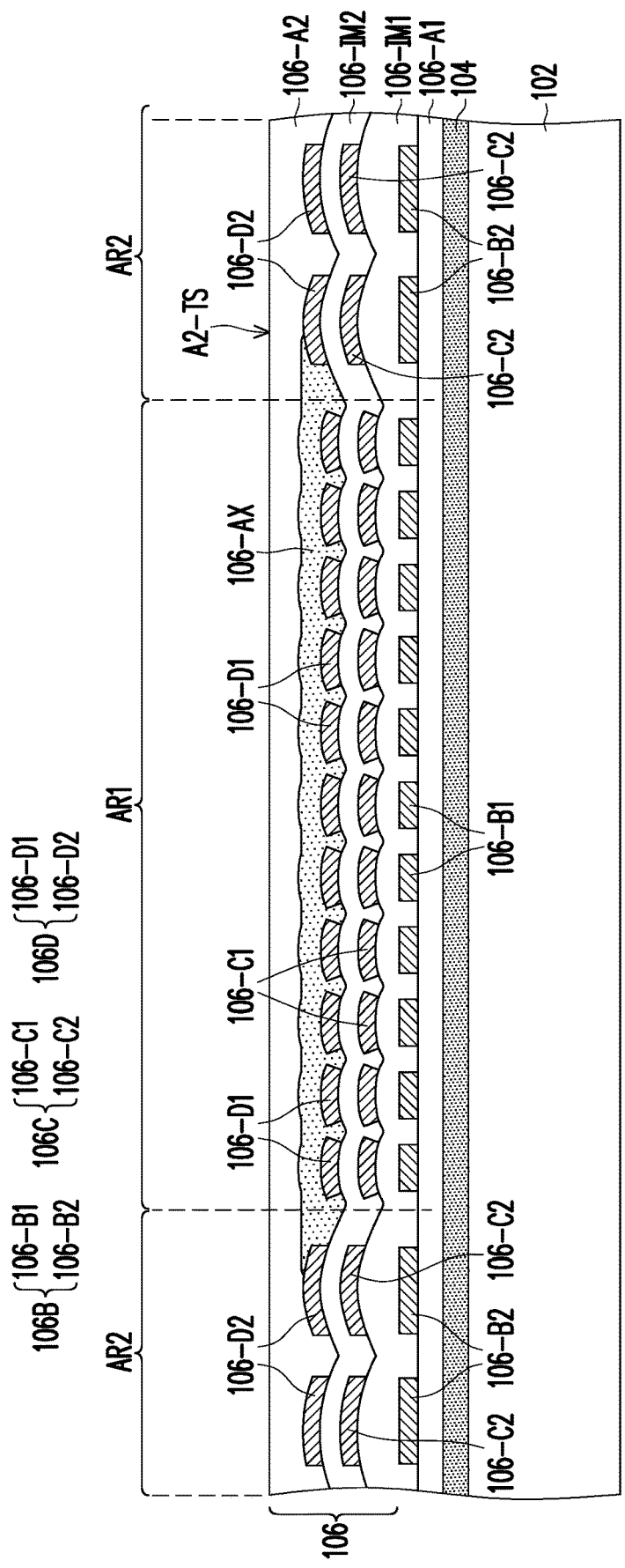
FIG. 24 and FIG. 25 are schematic sectional views of various stages in a method of fabricating a package structure according to some other exemplary embodiments of the present disclosure.
Figure 25:
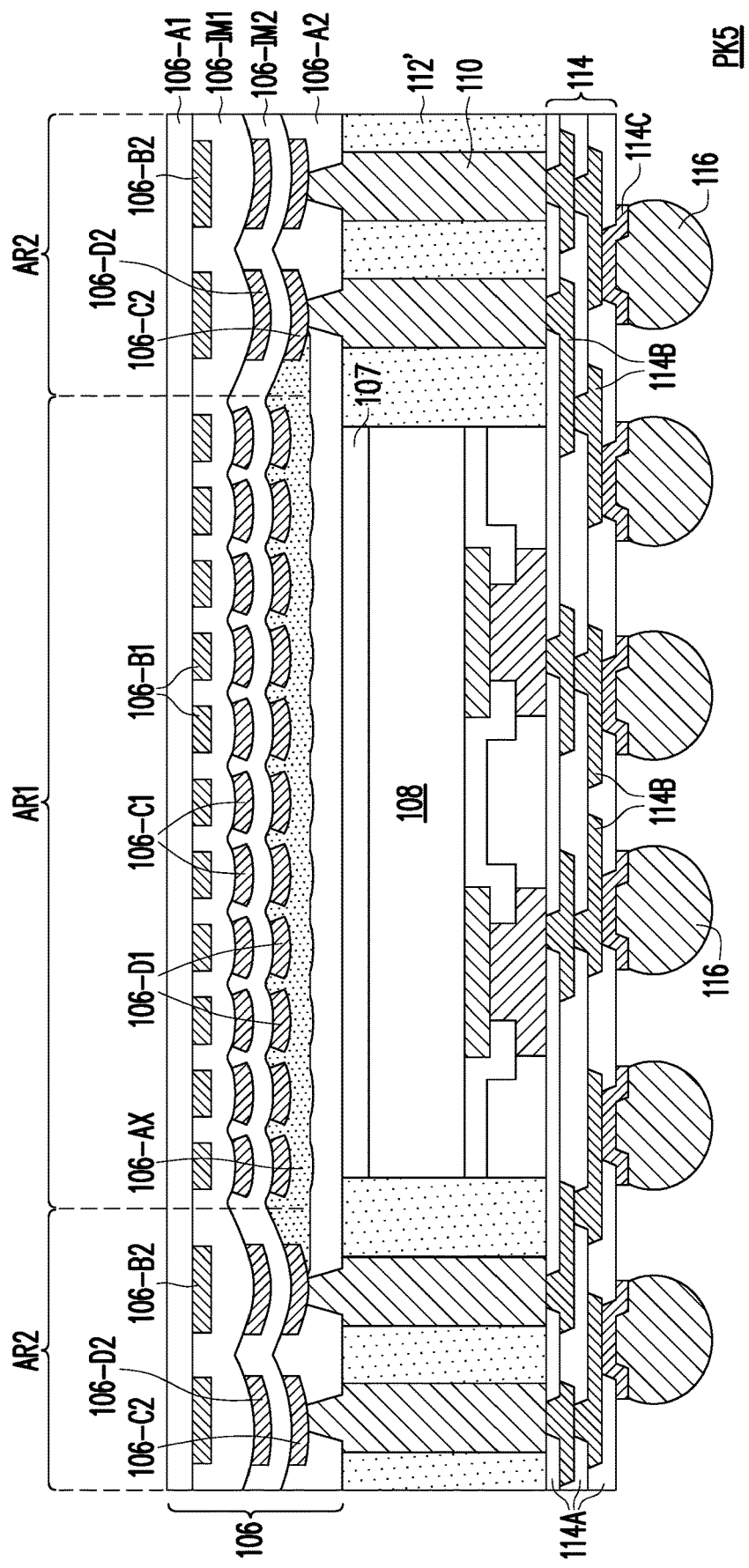

FIG. 24 and FIG. 25 are schematic sectional views of various stages in a method of fabricating a package structure according to some other exemplary embodiments of the present disclosure. The method illustrated in FIG. 24 and FIG. 25 is similar to the method illustrated in FIG. 1 to FIG. 12. Therefore, the same reference numerals are used to refer to the same or liked parts, and its detailed description will be omitted herein. The difference between the embodiments is in the design of the first redistribution layer 106.

In the previous embodiment, the first redistribution layer 106 is shown to include one intermediate dielectric layer 106-IM1 in between the bottom dielectric layer 106-A1 and the top dielectric layer 106-A2. However, the disclosure is not limited thereto. As illustrated in FIG. 24, in some embodiments, the intermediate dielectric layer may include an intermediate dielectric layer 106-IM1 (a first dielectric layer) disposed on the bottom dielectric layer 106-A1, and an intermediate dielectric layer 106-IM2 (a second dielectric layer) disposed on the intermediate dielectric layer 106-IM1. In other words, there may be two or more dielectric layers located between the bottom dielectric layer 106-A1 and the top dielectric layer 106-A2, which may be adjusted based on design requirements. In some embodiments, both the intermediate dielectric layer 106-IM1 and the intermediate dielectric layer 106-IM2 have uneven top surfaces. In some embodiments, the intermediate dielectric layer 106-IM2 is formed over the intermediate dielectric layer 106-IM1 to cover the first conductive elements 106-C1 and the second conductive elements 106-C2. Furthermore, a conductive layer 106D including first conductive elements 106-D1 and second conductive elements 106-D2 are respectively formed over the intermediate dielectric layer 106-IM2 in the first region AR1 and the second region AR2. The conductive layer 106D may have a similar arrangement and are made of similar materials as with the second conductive layer 106C, thus its details will be omitted herein.

In some embodiments, similar to the methods described in FIG. 5 and FIG. 6, at least one auxiliary dielectric portion 106-AX is formed over the intermediate dielectric layer 106-IM2, and covering and contacting a first portion of the conductive layer 106D, and revealing a second portion of the second conductive layer 106D. For example, the auxiliary dielectric portion 106-AX is disposed on the recessed portion (not labeled) of the intermediate dielectric layer 106-IM2 and covering and contacting the top surface of the first conductive elements 106-D1, while revealing portions of the second conductive elements 106-D2. Subsequently, a top dielectric layer 106-A2 is formed over the intermediate dielectric layer 106-IM2 and on the auxiliary dielectric portion 106-AX to complete the formation of the first redistribution layer 106.

Referring to FIG. 25, the same steps described in FIG. 7 to FIG. 12 may be performed to complete the attachment of the semiconductor die 108, the formation of the through vias 110, the formation of the second redistribution layer 114, and the formation of the conductive balls 116 on the second redistribution layer 114. As such, a package structure PK5 in accordance with some embodiments of the present disclosure is accomplished. In the package structure PK5, since an auxiliary dielectric portion 106-AX is formed in the first redistribution layer 106, the first redistribution layer 106 may have a planarized top surface, and a void issue during attachment of semiconductor dies onto the first redistribution layer 106 may be prevented. As such, the package structure PK5 may have improved reliability.

Figure 26:
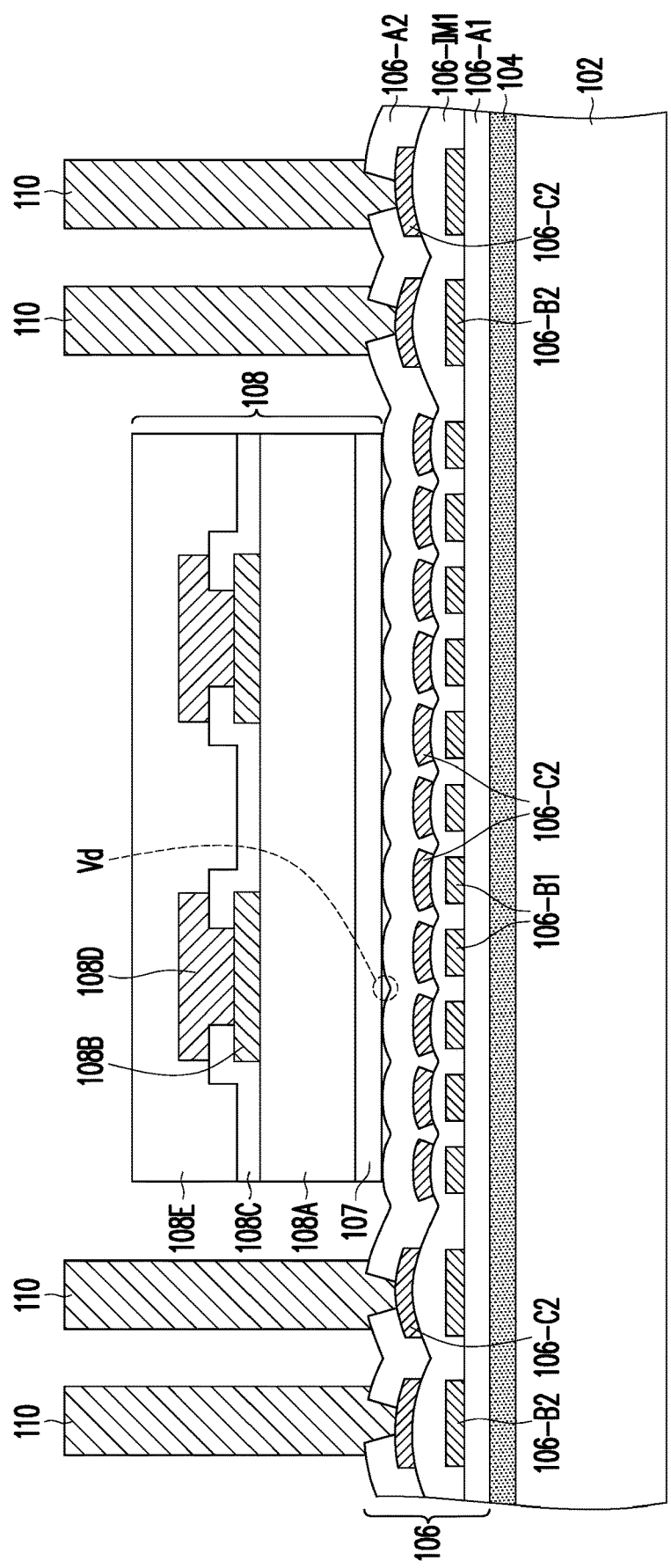
FIG. 26 is a schematic sectional view of one stage of manufacturing a package structure according to some comparative embodiment of the present disclosure.

FIG. 26 is a schematic sectional view of one stage of manufacturing a package structure according to some comparative embodiment of the present disclosure. The intermediate structure illustrated in FIG. 26 is similar to the intermediate structure illustrated in FIG. 7. Therefore, the same reference numerals are used to refer to the same or liked parts, and its detailed description will be omitted herein. The difference between the embodiments is in the design of the first redistribution layer 106. As illustrated in FIG. 26, in the comparative embodiment, the auxiliary dielectric portion 106-AX is removed from the first redistribution layer 106. As such, when the top dielectric layer 106-A2 is formed over the intermediate dielectric layer 106-IM1, the top dielectric layer 106-A2 will also have an uneven top surface. Therefore, when the semiconductor die 108 is bonded to the first redistribution layer 106, there may be voids Vd that exists between the die attach film 107 and a top surface of the first redistribution layer 106. Overall, the performance of the die bonding process is deteriorated, and there will be reliability issues in the formed package structure.

In the above-mentioned embodiments, the package structure includes a first redistribution layer having an auxiliary dielectric portion disposed in between the first dielectric layer and the top dielectric layer. As such, the top dielectric layer may have a planarized top surface, and a high topography issue of a die bonding surface on the first redistribution layer can be eliminated. Furthermore, the die attach film of respective semiconductor dies may be attached onto the first redistribution layer in a void-free manner. Overall, the die bonding process has an improved process window, and the obtained package structure has higher reliability.

In accordance with some embodiments of the present disclosure, a package structure includes a first redistribution layer, a semiconductor die and a second redistribution layer. The first redistribution layer includes a first dielectric layer, first conductive elements, second conductive elements, a top dielectric layer and at least one auxiliary dielectric portion. The first conductive elements are disposed on the first dielectric layer with a first pattern density. The second conductive elements are disposed on the first dielectric layer aside the first conductive elements with a second pattern density different from the first pattern density. The top dielectric layer is disposed on the first dielectric layer and covering and contacting a top surface of the second conductive elements. The auxiliary dielectric portion is disposed in between the first dielectric layer and the top dielectric layer, and covering and contacting a top surface of the first conductive elements. The semiconductor die is disposed on the first redistribution layer. The second redistribution layer is disposed on the semiconductor die, and electrically connected to the semiconductor die and the first redistribution layer.

In accordance with some other embodiments of the present disclosure, a package structure includes a backside redistribution layer, a semiconductor die and a plurality of through vias. The backside redistribution layer includes a bottom dielectric layer, a first conductive layer, an intermediate dielectric layer, a second conductive layer, an auxiliary dielectric portion and a top dielectric layer. The first conductive layer is disposed on the bottom dielectric layer and having a planar top surface. The intermediate dielectric layer is disposed on the bottom dielectric layer and covering the first conductive layer, wherein the intermediate dielectric layer has an uneven top surface. The second conductive layer is disposed on the uneven top surface of the intermediate dielectric layer, wherein the second conductive layer has a curved top surface. The auxiliary dielectric portion is covering and contacting a first portion of the second conductive layer, and revealing a second portion of the second conductive layer. The top dielectric layer is disposed on and covering the intermediate dielectric layer, the auxiliary dielectric portion, and the second portion of the second conductive layer. The semiconductor die is attached to the backside redistribution layer through a die attach film. The plurality of through vias is surrounding the semiconductor die and electrically connected to the backside redistribution layer.

In accordance with yet another embodiment of the present disclosure, a method of fabricating a package structure is described. The method includes the following steps. A carrier is provided. A first redistribution layer is formed on the carrier, wherein the first redistribution layer is formed by the following steps. A first dielectric layer is formed on the carrier. A plurality of first conductive elements is formed on the first dielectric layer with a first pattern density. A plurality of second conductive elements is formed on the first dielectric layer aside the plurality of first conductive elements, wherein the plurality of second conductive elements has a second pattern density different from the first pattern density. At least one auxiliary dielectric portion is formed to cover and contact a top surface of the plurality of first conductive elements. A top dielectric layer is formed on the first dielectric layer and covering and contacting a top surface of the plurality of second conductive elements, wherein the at least one auxiliary dielectric portion is disposed in between the first dielectric layer and the top dielectric layer. A semiconductor die is disposed on the first redistribution layer. A second redistribution layer is formed on the semiconductor die, wherein the second redistribution layer is electrically connected to the semiconductor die and the first redistribution layer. The carrier is debonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first redistribution layer, comprising:
      a first dielectric layer;
      a plurality of first conductive elements disposed on the first dielectric layer with a first pattern density;
      a plurality of second conductive elements disposed on the first dielectric layer aside the plurality of first conductive elements with a second pattern density different from the first pattern density;
      a top dielectric layer disposed on the first dielectric layer and covering and contacting a top surface of the plurality of second conductive elements; and
      at least one auxiliary dielectric portion disposed in between the first dielectric layer and the top dielectric layer, and covering and contacting a top surface of the plurality of first conductive elements;
   a semiconductor die disposed on the first redistribution layer; and
   a second redistribution layer disposed on the semiconductor die, and electrically connected to the semiconductor die and the first redistribution layer.

2. The package structure according to claim 1, wherein the first dielectric layer has an uneven top surface, and the top dielectric layer and the at least one auxiliary dielectric portion are covering and contacting the uneven top surface.

3. The package structure according to claim 1, wherein the first dielectric layer includes a recessed portion, and the plurality of first conductive elements is disposed on the recessed portion of the first dielectric layer.

4. The package structure according to claim 1, wherein the at least one auxiliary dielectric portion is covering and contacting a side surface of the plurality of second conductive elements.

5. The package structure according to claim 4, wherein the at least one auxiliary dielectric portion is covering and contacting a first portion of the top surface of the plurality of second conductive elements, and the top dielectric layer is covering and contacting a second portion of the top surface of the plurality of second conductive elements.

6. The package structure according to claim 1, wherein the at least one auxiliary dielectric portion comprises two or more auxiliary dielectric portions disposed in between the first dielectric layer and the top dielectric layer, and the two or more auxiliary dielectric portions are separated from one another.

7. The package structure according to claim 1, wherein the top dielectric layer has a protruding portion, and the semiconductor die is disposed on the protruding portion.

8. The package structure according to claim 1, wherein a thickness of the at least one auxiliary dielectric portion is smaller than a thickness of the first dielectric layer, and smaller than a thickness of the top dielectric layer.

9. A package structure, comprising:
a backside redistribution layer, comprising:
- a bottom dielectric layer;
- a first conductive layer disposed on the bottom dielectric layer and having a planar top surface;
- an intermediate dielectric layer disposed on the bottom dielectric layer and covering the first conductive layer, wherein the intermediate dielectric layer has an uneven top surface;
- a second conductive layer disposed on the uneven top surface of the intermediate dielectric layer, wherein the second conductive layer has a curved top surface;
- an auxiliary dielectric portion covering and contacting a first portion of the second conductive layer, and revealing a second portion of the second conductive layer;
- a top dielectric layer disposed on and covering the intermediate dielectric layer, the auxiliary dielectric portion, and the second portion of the second conductive layer;
a semiconductor die attached to the backside redistribution layer through a die attach film; and
a plurality of through vias surrounding the semiconductor die and electrically connected to the backside redistribution layer.

10. The package structure according to claim 9, wherein the intermediate dielectric layer comprises a first dielectric layer disposed on the bottom dielectric layer, and a second dielectric layer disposed on the first dielectric layer, both the first dielectric layer and the second dielectric layer has the uneven top surface, and the second conducive layer is disposed on the uneven top surface of the second dielectric layer.

11. The package structure according to claim 9, wherein the first portion of the second conductive layer includes a plurality of first conductive elements arranged with a first pattern density, and the second portion of the second conductive layer includes a plurality of second conductive elements arranged with a second pattern density, and the second pattern density is different form the first pattern density.

12. The package structure according to claim 11, wherein the second pattern density is greater than the first pattern density.

13. The package structure according to claim 9, wherein the intermediate dielectric layer includes a recessed portion, and the auxiliary dielectric portion is disposed on the recessed portion of the intermediate dielectric layer.

14. The package structure according to claim 9, further comprising a second auxiliary dielectric portion that is covering and contacting the first portion of the second conductive layer, and revealing the second portion of the second conductive layer, wherein the second auxiliary dielectric portion is separated from the auxiliary dielectric portion.

15. The package structure according to claim 14, wherein a top surface area occupied by the auxiliary dielectric portion is different form a top surface area occupied by the second auxiliary dielectric portion.

* * * * *